(12) United States Patent
Nii

(10) Patent No.: US 8,238,192 B2
(45) Date of Patent: Aug. 7, 2012

(54) SEMICONDUCTOR MEMORY DEVICE HAVING MULTIPLE PORTS

(75) Inventor: Koji Nii, Tokyo (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 13/026,649

(22) Filed: Feb. 14, 2011

(65) Prior Publication Data

US 2011/0134706 A1    Jun. 9, 2011

Related U.S. Application Data

(62) Division of application No. 12/278,730, filed as application No. PCT/JP2007/051984 on Feb. 6, 2007, now abandoned.

(30) Foreign Application Priority Data

Feb. 8, 2006  (JP) .................................. 2006-031391

(51) Int. Cl.
*G11C 8/00*         (2006.01)
(52) U.S. Cl. ............... 365/230.05; 365/154; 365/189.14
(58) Field of Classification Search ............. 365/189.03, 365/189.04, 189.14, 189.15, 189.16, 230.03, 365/230.05, 230.06, 233.19, 154
See application file for complete search history.

(56) References Cited

U.S. PATENT DOCUMENTS

| 6,469,328 | B2 | 10/2002 | Yanai et al. |
| 6,731,566 | B1 * | 5/2004 | Sywyk et al. ............ 365/230.05 |
| 6,762,972 | B2 * | 7/2004 | La ............................. 365/233.1 |
| 6,992,947 | B1 | 1/2006 | Pan et al. |
| 7,254,088 | B2 * | 8/2007 | Kurumada et al. ...... 365/230.05 |
| 7,260,018 | B2 | 8/2007 | Nii |
| 7,411,860 | B2 | 8/2008 | Nii |
| 7,492,627 | B2 | 2/2009 | Russell et al. |
| 7,570,540 | B2 | 8/2009 | Nii |
| 2005/0002215 | A1 * | 1/2005 | Morishima ................... 365/120 |
| 2005/0247981 | A1 | 11/2005 | Wang |
| 2005/0270885 | A1 | 12/2005 | Masuo |

FOREIGN PATENT DOCUMENTS

| JP | 7-141859 | 6/1995 |
| JP | 2003-91992 | 3/2003 |
| JP | 2005-328052 | 11/2005 |

* cited by examiner

*Primary Examiner* — Huan Hoang
*Assistant Examiner* — Kretelia Graham
(74) *Attorney, Agent, or Firm* — McDermott Will & Emery LLP

(57) ABSTRACT

A multiple-port semiconductor memory device capable of achieving a smaller circuit area is provided. A power supply line supplying an operation voltage of a memory cell is formed in an identical metal interconnection layer where word lines are formed and it is provided adjacent to and between corresponding first word line and second word line. Then, for example, when the same memory cell row is accessed, a voltage level of the power supply line is raised by a coupling capacitance of the word lines. Thus, even in identical-row-access, static noise margin in identical-row-access can be maintained to be as great as that in different-row-access. Therefore, for example, even when a size or the like of a driver transistor is not made larger, deterioration of static noise margin can be suppressed and a circuit area can be made smaller.

5 Claims, 23 Drawing Sheets

FIG.10
(a)
DURING DIFFERENT-ROW-ACCESS
(DURING ACCESS TO ONE PORT)
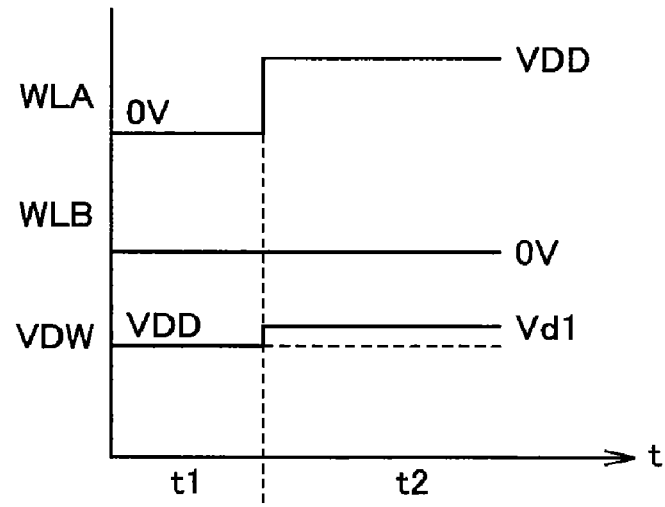
(b)
DURING IDENTICAL-ROW-ACCESS
(DURING ACCESS TO BOTH PORTS)
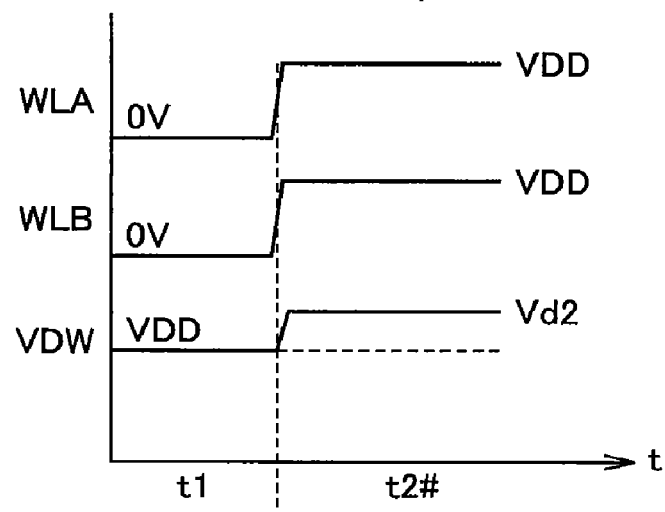

FIG.19
(a) WHEN STARTING COLUMN COORDINATE DESIGNATES 8Nth PIXEL
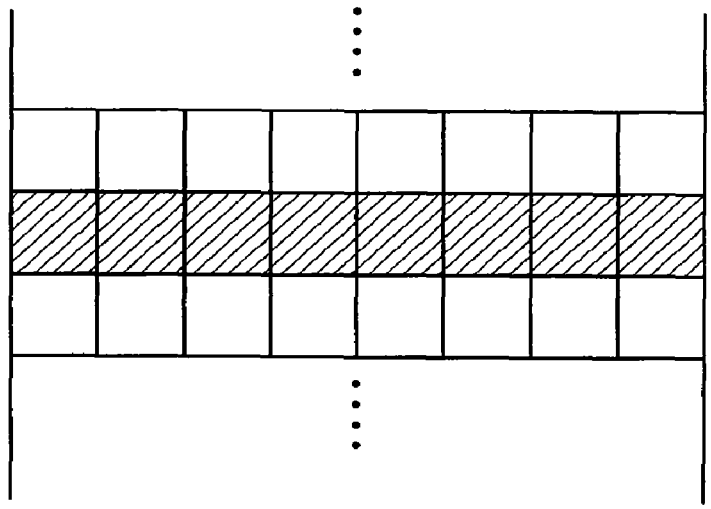
*SIMULTANEOUSLY ACCESS DATA OF 8 PIXELS ARRANGED IN ONE ROW
(b) WHEN STARTING COLUMN COORDINATE DESIGNATES PIXEL OTHER THAN 8Nth PIXEL
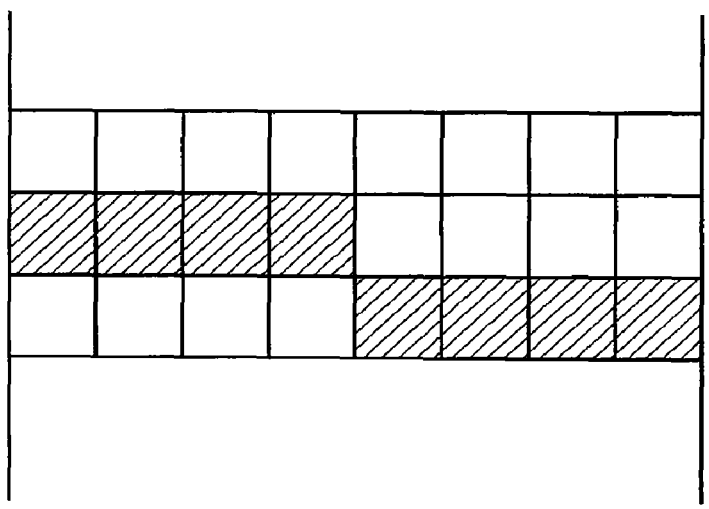
*SIMULTANEOUSLY ACCESS DATA OF 8 PIXELS ARRANGED IN TWO ROWS ACROSS ROW BOUNDARY

SEMICONDUCTOR MEMORY DEVICE HAVING MULTIPLE PORTS

RELATED APPLICATIONS

This application is a Divisional of U.S. patent application Ser. No. 12/278,730 filed on Aug. 7, 2008, now abandoned which is a U.S. National Phase under 35 U.S.C. §371 of International Application No. PCT/JP2007/051984, filed on Feb. 6, 2007, which in turn claims the benefit of Japanese Application No. 2006-031391, filed on Feb. 8, 2006, the disclosures of which Applications are incorporated by reference herein.

TECHNICAL FIELD

The present invention relates to a semiconductor memory device, and particularly to an SRAM (Static Random Access Memory) having multiple ports.

BACKGROUND ART

With widespread use of portable terminal equipment in recent years, digital signal processing for processing a large amount of data such as voice/sound and images at high speed has become more important. An SRAM capable of high-speed access processing occupies an important place as a semiconductor memory device to be mounted on such portable terminal equipment.

On the other hand, a multiple-port semiconductor memory device capable of independent data writing and reading using each port has attracted attention, and an SRAM having multiple ports has increasingly been demanded.

In the case of dual ports representing one type of multiple ports, data can simultaneously be written and read through two ports.

In an SRAM having such dual ports, however, for example, particularly if data writing to the same row is performed at a time, generally, high load may be imposed on a memory cell and generally, such a command input may exceptionally be prohibited.

In this regard, Japanese Patent Laying-Open No. 07-141859 discloses a simplified method of sensing simultaneous access to the same row.

Here, when simultaneous access to the same row is made, though simultaneous data writing to the same row is prohibited, simultaneous data reading can be performed without any difficulty.

Patent Document 1: Japanese Patent Laying-Open No. 07-141859

DISCLOSURE OF THE INVENTION

Problems to be Solved by the Invention

Meanwhile, generally, in designing an SRAM memory cell, a static noise margin (hereinafter also referred to as SNM) has been known as a margin indicator for preventing data read corruption.

In the SRAM memory cell having dual ports described above, two word lines are provided for the same row and the following two cases are possible: a case where two word lines simultaneously rise; and a case where only one word line rises. Accordingly, the margin of the SRAM memory cell should be designed in consideration of SNM for both cases.

In this regard, the SNM tends to be smaller when two word lines simultaneously rise than when only one word line rises.

Therefore, in the case of the SRAM memory cell having dual ports, as an approach to improve SNM, the design for ensuring SNM has been such that a size of a driver transistor of an N-channel MOS transistor configuring an inverter in a flip-flop circuit is made greater than an access transistor electrically coupled to word lines in the same row.

Accordingly, not only the SRAM memory cell having dual ports is greater in the number of transistors by two than the SRAM memory cell having a single port, but also the size of the driver transistor should be made larger. Therefore, a cell area as a whole is disadvantageously increased.

In addition, by making the size of the driver transistor larger, a leakage current during stand-by also increases.

In order to solve the above-described problems, an object of the present invention is to provide a multiple-port semiconductor memory device capable of achieving a smaller circuit area.

Meanwhile, for example, in the case of a dual-port SRAM memory cell, access can independently be made through two ports. On the other hand, for example, if word lines in two memory cell rows different from each other are selected, data reading from different memory cell rows through respective ports can only be performed, and combined output from these ports has not been possible.

Another object of the present invention is to provide a multiple-port semiconductor memory device capable of data reading with high degree of freedom.

Means for Solving the Problems

A semiconductor memory device according to the present invention includes: a memory array having a plurality of memory cells arranged in matrix; first and second ports independent of each other, performing transmission and reception of an input/output signal; and a selection circuit capable of selection in accordance with addresses input to the first and second ports respectively, with periods of access to the memory array overlapping with each other.

The memory array includes a plurality of first and second word lines provided in correspondence with memory cell rows respectively, a plurality of first and second bit lines provided in correspondence with memory cell columns respectively, and a plurality of power supply lines provided in correspondence with the memory cell rows respectively, each for supplying an operation voltage of a flip-flop circuit in the memory cell in a corresponding memory cell row.

Each memory cell includes a flip-flop circuit for setting first and second storage nodes to one and another of first and second potential levels in accordance with stored data. In addition, each memory cell includes a first gate transistor having a gate electrically coupled to a corresponding first word line, for electrically coupling a corresponding first bit line to the flip-flop circuit, and a second gate transistor having a gate electrically coupled to a corresponding second word line, for electrically coupling a corresponding second bit line to the flip-flop circuit.

The selection circuit includes first and second row decoders provided in correspondence with the first and second ports and outputting row selection instructions in accordance with input addresses, respectively, and a plurality of word drivers provided in correspondence with the memory cell rows respectively, each for driving the corresponding first and second word lines in accordance with a result of row selection by the first and second row decoders.

Each word driver sets a voltage level of a corresponding word line to a prescribed voltage level when it receives an input of the row selection instruction from at least one of the first and second row decoders. In each memory cell row, the corresponding power supply line is formed in an identical metal interconnection layer where the word line is formed, and is provided adjacent to and between the corresponding first word line and the corresponding second word line.

Another semiconductor memory device according to the present invention includes N memory blocks arranged along a column direction and each having a plurality of memory cells arranged in matrix.

In addition, the semiconductor memory device includes N first and second ports independent of each other, provided in correspondence with the memory blocks, each performing transmission and reception of an input/output signal, and N selection circuits each capable of selection in accordance with addresses input to the first and second ports corresponding to the memory block respectively, with periods of access to corresponding memory block overlapping with each other.

Each memory block includes a plurality of first and second word lines provided in correspondence with memory cell rows respectively, a plurality of first bit lines connected to the corresponding first port and provided in correspondence with memory cell columns respectively, and a plurality of second bit lines connected to the corresponding second port and provided in correspondence with the memory cell columns respectively. Each memory cell includes a flip-flop circuit for setting first and second storage nodes to one and another of first and second potential levels in accordance with stored data, a first gate transistor having a gate electrically coupled to a corresponding first word line, for electrically coupling a corresponding first bit line to the flip-flop circuit, and a second gate transistor having a gate electrically coupled to a corresponding second word line, for electrically coupling a corresponding second bit line to the flip-flop circuit. Each selection circuit includes first and second row decoders provided in correspondence with the first and second ports and outputting row selection instructions in accordance with input addresses, respectively, and a plurality of word drivers provided in correspondence with the memory cell rows respectively, each for driving the corresponding first and second word lines in accordance with a result of row selection by the first and second row decoders. The semiconductor memory device further includes (N+1) reading and writing circuits each electrically coupled to at least one of one and another of the plurality of first and second bit lines provided in correspondence with the first and second ports of adjacent memory blocks, for performing data reading and data writing, one reading and writing circuit being provided in correspondence with the first port on one side of the memory block and one reading and writing circuit being provided in correspondence with the second port on another side thereof. When an identical memory block is selected and the first and second ports are used to perform data reading, a reading and writing circuit on one side of the identical memory block is used and connected to the plurality of first bit lines to perform data reading through the first port and the reading and writing circuit on another side is used and connected to the plurality of second bit lines to perform data reading through the second port. When two memory blocks on one side and another side are selected and the first and second ports are used to perform data reading, the reading and writing circuit on one side provided in correspondence with the memory block on one side out of the two memory blocks is used and connected to the plurality of first bit lines to perform data reading through the first port and the reading and writing circuit on another side provided in correspondence with the memory block on another side out of the two memory blocks is used and connected to the plurality of second bit lines to perform data reading through the second port.

Yet another semiconductor memory device according to the present invention includes: a memory array having a plurality of memory cells arranged in matrix; first and second ports independent of each other, performing transmission and reception of an input/output signal; and a selection circuit capable of selection in accordance with addresses correspondingly input to the first and second ports, with periods of access to the memory array overlapping with each other. The memory array includes a plurality of first and second word lines provided in correspondence with memory cell rows respectively, and a plurality of first and second bit lines provided in correspondence with memory cell columns respectively. Each memory cell includes a flip-flop circuit for setting first and second storage nodes to one and another of first and second potential levels in accordance with stored data, a first gate transistor having a gate electrically coupled to a corresponding first word line, for electrically coupling a corresponding first bit line to the flip-flop circuit, and a second gate transistor having a gate electrically coupled to a corresponding second word line, for electrically coupling a corresponding second bit line to the flip-flop circuit. The selection circuit includes first and second row decoders provided in correspondence with the first and second ports and outputting row selection instructions in accordance with input addresses, respectively, and a plurality of word drivers provided in correspondence with the memory cell rows respectively, each for driving the corresponding first and second word lines in accordance with a result of row selection by the first and second row decoders. The semiconductor memory device further includes: a first reading and writing circuit provided in correspondence with the first port and electrically coupled to the plurality of first bit lines, for performing data reading and data writing; a second reading and writing circuit provided in correspondence with the second port and electrically coupled to the plurality of second bit lines, for performing data reading and data writing; and a plurality of switching circuits corresponding to the first reading and writing circuit, provided in correspondence with the memory cell columns respectively, and each switching connection with the first bit line to electrical connection with the second bit line in response to an instruction.

Yet another semiconductor memory device according to the present invention includes: a memory array having a plurality of memory cells arranged in matrix; first and second ports independent of each other, performing transmission and reception of an input/output signal; and a selection circuit capable of selection in accordance with addresses correspondingly input to the first and second ports, with periods of access to the memory array overlapping with each other. The memory array includes a plurality of first and second word lines provided in correspondence with memory cell rows respectively, and a plurality of first and second bit lines provided in correspondence with memory cell columns respectively. Each memory cell includes a flip-flop circuit for setting first and second storage nodes to one and another of first and second potential levels in accordance with stored data, a first gate transistor having a gate electrically coupled to a corresponding first word line, for electrically coupling a corresponding first bit line to the flip-flop circuit, and a second gate transistor having a gate electrically coupled to a corresponding second word line, for electrically coupling a corresponding second bit line to the flip-flop circuit. The selection circuit includes a row decoder outputting a row selection instruction in accordance with an input address, and a plurality of word driver units provided in correspondence with the first and second word lines corresponding to two adjacent memory cell rows, each for driving the corresponding first and second word lines based on a result of row selection. The semiconductor memory device further includes first and second reading and writing circuits provided in correspondence with the first and second ports respectively and electrically coupled to the plurality of first and second bit lines respectively, for performing data reading and data writing.

EFFECTS OF THE INVENTION

In the semiconductor memory device according to the present invention, in each memory cell row, the power supply line supplying the operation voltage of the memory cell is formed in the identical metal interconnection layer where the word line is formed, and is provided adjacent to and between the first word line and the second word line. Accordingly, during access to the same memory cell row, as the first and the second word lines are selected, voltage increase in the power supply line occurs due to a coupling capacitance. Therefore, a voltage level higher than a normal voltage level is set. Thus, even though a size or the like of a driver transistor is not made larger, deterioration of SNM with the increase in a power supply voltage can be suppressed during access to the same memory cell row and a circuit area can be made smaller.

Another semiconductor memory device according to the present invention is provided with N memory blocks and further with (N+1) reading and writing circuits electrically coupled to at least one of one and another of the plurality of first and second bit lines provided in correspondence with the first and second ports of adjacent memory blocks, for performing data reading and data writing, one reading and writing circuit being provided in correspondence with the first port on one side of each of N memory blocks and one reading and writing circuit being provided in correspondence with the second port on another side thereof.

According to this configuration, the reading and writing circuit provided between two adjacent memory blocks is shared by the two adjacent memory blocks, so that a circuit area can be made smaller.

Yet another semiconductor memory device according to the present invention is provided with a switching circuit provided in correspondence with the memory cell column and switching connection with one bit line out of the corresponding first and second bit lines to electrical connection with the other bit line in response to an external control instruction.

Thus, when the first and second reading and writing circuits perform data reading from two memory cell rows different from each other, the switching circuit can be used to switch bit line connection. Therefore, when the word lines in two memory cell rows different from each other are selected, data from each memory cell row can be output in combination, and hence data reading with high degree of freedom can be performed.

BRIEF DESCRIPTION OF THE DRAWINGS

FIG. 10 is a diagram illustrating voltage increase in the power supply line during different-row-access and identical-row-access.

FIG. 19 is a diagram illustrating en example of access to 8-pixel data.

Figure 1:
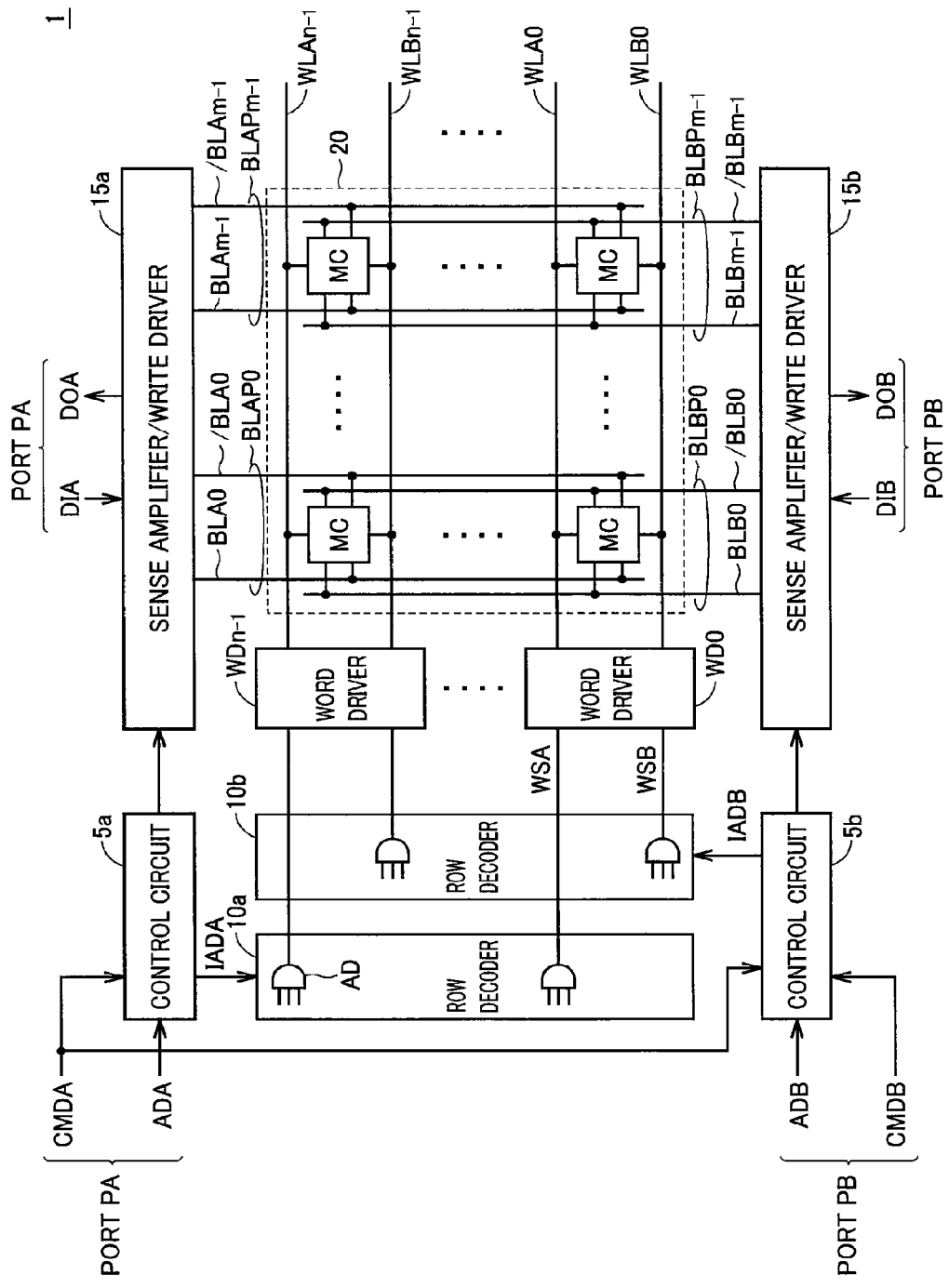
FIG. 1 is a schematic block diagram of a semiconductor memory device 1.

DESCRIPTION OF THE REFERENCE SIGNS 1, 1#, 1#a, 1#b semiconductor memory device; 5a, 5b, 5c, 5d control circuit; 10a, 10b, 10c, 10d row decoder; 15a, 15b, 15c, 15d sense amplifier/write driver; WD word driver; WDUAGa, WDUAGb, WDUAGc, WDUBGa, WDUBGb, WDUBGc word driver unit group; and SLC0 to SLCm−1 selector circuit.

BEST MODES FOR CARRYING OUT THE INVENTION

An embodiment of the present invention will be described hereinafter in detail with reference to the drawings. In the drawings, the same or corresponding elements have the same reference characters allotted, and detailed description thereof will not be repeated.

(First Embodiment)

FIG. 1 is a schematic block diagram of a semiconductor memory device 1 according to a first embodiment of the present invention.

Referring to FIG. 1, semiconductor memory device 1 according to the first embodiment of the present invention includes a control circuit 5a for port PA, a control circuit 5b for port PB, a sense amplifier/write driver 15a for port PA, a sense amplifier/write driver 15b for port PB, a row decoder 10a for port PA, a row decoder 10b for port PB, a memory array 20, and word drivers WD0 to WDn−1.

Control circuit 5a outputs a buffered internal row address signal IADA to row decoder 10a based on an input of an address signal ADA input from port PA. In addition, control circuit 5a issues a necessary instruction or executes necessary control for other peripheral circuits so as to perform a prescribed operation based on a command signal CMDA input from port PA. For example, during data reading, control circuit 5a controls sense amplifier/write driver 15a to give an instruction to output storage data read through a bit line to the outside as read data DOA, and during data writing, control circuit 5a gives an instruction to write externally input write data DIA into a memory cell in accordance with a selected address through the bit line.

Control circuit 5b is also similar to control circuit 5a, and outputs a buffered internal row address signal IADB to row decoder 10b, based on an input of an address signal ADB input from port PB. In addition, control circuit 5b issues a necessary instruction or executes necessary control for other peripheral circuits so as to perform a prescribed operation based on a command signal CMDB input from port PB. For example, during data reading, control circuit 5b controls sense amplifier/write driver 15b to give an instruction to output storage data read through a bit line to the outside as read data DOB, and during data writing, control circuit 5b gives an instruction to write externally input write data DIB into a memory cell in accordance with a selected address through the bit line. Though not shown, control circuits 5a and 5b are assumed to perform a series of processes based on inputs of an address signal and a command signal in synchronization of a clock signal. It is noted that control circuit 5b receives an input of command CMDA input to control circuit 5a, and if control circuits 5a and 5b both select a write command, control is carried out such that the write command in control circuit 5b is not executed as exception. In terms of operation, a write command and a read command can otherwise be executed by using both ports, however, in the present example, for the sake of simplification, description will be given hereinafter assuming that commands CMD input to control circuits 5a and 5b are both read commands. Row decoder 10a outputs a decode signal representing a result of row selection to word drivers WD0 to WDn−1 (hereinafter, also collectively referred to as word driver WD) based on an input of buffered internal row address signal IADA from control circuit 5a. Similarly, row decoder 10b outputs a decode signal representing a result of row selection to word drivers WD0 to WDn−1 based on an input of buffered internal row address signal IADB from control circuit 5b. Row decoder 10a is constituted of a plurality of logic circuits AD, and it is assumed in this example that a decode signal (row selection signal) at "H" level is output to corresponding word driver WD based on one of combinations of input internal row address signals.

Memory array 20 has a plurality of memory cells MC integrated and arranged in matrix.

Memory array 20 has a plurality of word lines WLA, WLB for ports PA and PB provided in correspondence with the memory cell rows respectively. In addition, memory array 20 includes power supply lines VDW provided in correspondence with the memory cell rows and receiving supply of a power supply voltage which will be described later.

In the present example, n memory cell rows are arranged, and for example, word lines WLA0, WLB0 and WLAn−1, WLBn−1 are shown in correspondence with the first and nth memory cell rows respectively.

In addition, bit line pairs BLAP and BLBP for ports PA and PB are provided in correspondence with the memory cell columns respectively.

In the present example, m memory cell columns are arranged, and for example, bit line pairs BLAP0, BLBP0 and BLAPm−1, BLBPm−1 are shown in correspondence with the first and mth memory cell columns respectively.

Each bit line pair has two bit lines complementary to each other, and bit line pair BLAP0 includes bit lines BLA0, BLA0 (hereinafter, also collectively referred to as bit lines BLA, BLA). Similarly, bit line pair BLBP0 includes bit lines BLB0, BLB0 (hereinafter, also collectively referred to as bit lines BLB, BLB).

Word drivers WD are provided in correspondence with respective memory cell rows, selectively activate corresponding word line WLA or WLB based on a decode signal output from row decoder 10a, 10b, and drive power supply lines VDW, which will be described later, provided in correspondence with respective memory cell rows.

Sense amplifier/write drivers 15a, 15b amplify data transmitted to bit line pair BLAP or BLBP during data reading in response to an instruction from control circuits 5a, 5b and output the data as read data DOA, DOB. In addition, during data writing, sense amplifier/write drivers 15a, 15b transmit a voltage level in accordance with write data DIA, DIB to bit line pair BLAP or BLBP to bit line pair BLAP or BLBP.

Figure 2:
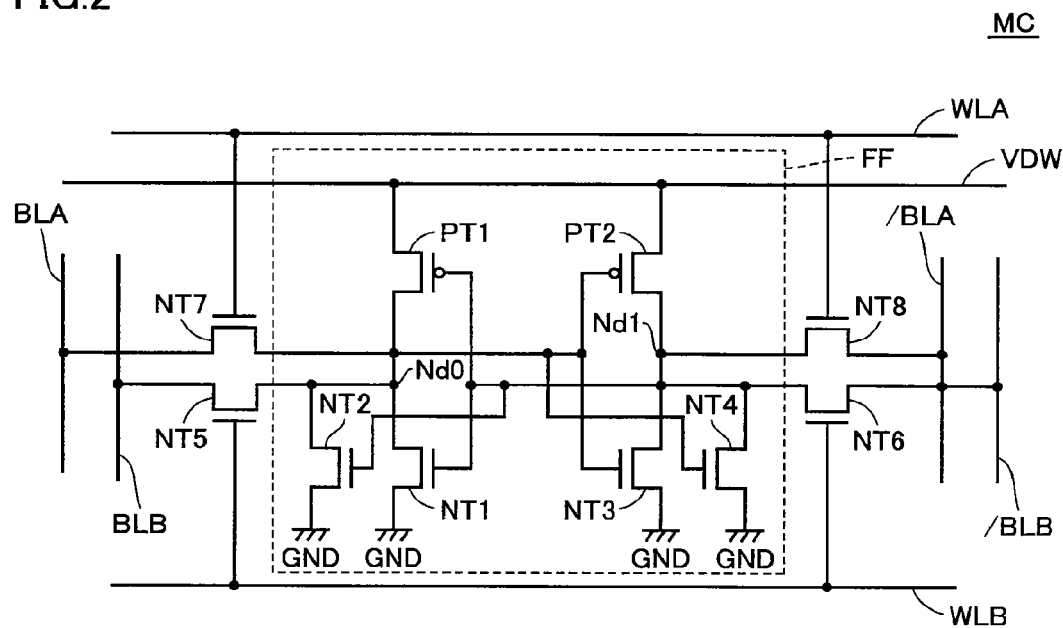
FIG. 2 is a diagram illustrating a configuration of a memory cell MC according to the first embodiment of the present invention.

FIG. 2 is a diagram illustrating a configuration of memory cell MC according to the first embodiment of the present invention.

Referring to FIG. 2, memory cell MC according to the first embodiment of the present invention includes transistors PT1, PT2 and NT1 to NT8. Here, transistors PT1, PT2 are assumed as P-channel MOS transistors by way of example. In addition, transistors NT1 to NT8 are assumed as N-channel MOS transistors by way of example. Here, transistors NT5 to NT8 are access transistors provided between bit lines and storage nodes. Moreover, transistors NT1 to NT4 and PT1, PT2 are driver transistors implementing inverters within memory cell MC.

Transistor PT1 is arranged between power supply line VDW supplied with a power supply voltage and a storage node Nd0 and has the gate electrically coupled to a storage node Nd1. Transistor NT1 is arranged between storage node Nd0 and a ground voltage GND, and has the gate electrically coupled to storage node Nd1. Transistor NT2 is arranged in parallel to transistor NT1 between storage node Nd0 and ground voltage GND, and has the gate electrically coupled to storage node Nd1. Transistor PT2 is arranged between power supply line VDW and storage node Nd1, and has the gate electrically coupled to storage node Nd0. Transistor NT3 is arranged between storage node Nd1 and ground voltage GND, and has the gate electrically coupled to storage node Nd0. Transistor NT4 is arranged in parallel to transistor NT3 between storage node Nd1 and ground voltage GND, and has the gate electrically coupled to storage node Nd0. These transistors PT1, PT2 and NT1 to NT4 form two CMOS inverters for holding a signal level at storage nodes Nd0 and Nd1, that are cross-coupled to form a CMOS-type flip-flop circuit.

Access transistor NT7 is arranged between storage node Nd0 and bit line BLA and has the gate electrically coupled to word line WLA. Access transistor NT8 is arranged between storage node Nd1 and bit line /BLA, and has the gate electrically coupled to word line WLA. Access transistor NT5 is arranged between storage node Nd0 and bit line BLB, and has the gate electrically coupled to word line WLB. Access transistor NT6 is arranged between storage node Nd1 and bit line BLB, and has the gate electrically coupled to WLB.

Data writing and reading to/from storage node Nd0 and storage node Nd1 is performed as a result of electrical coupling of storage nodes Nd0 and Nd1 to bit lines BLA and BLA or bit lines BLB and BLB, by turn-on of access transistor NT7 and access transistor NT8 or turn-on of access transistors NT5 and NT6 in response to activation (H level) of word line WLA or word line WLB.

For example, when word line WLA is inactivated (L level) and access transistors NT7 and NT8 are turned off, one of N-type and P-type MOS transistors in each CMOS inverter is turned on, in accordance with a level of data held at storage nodes Nd0 and Nd1. Thus, in accordance with the level of data held in the memory cell, storage nodes Nd0 and Nd1 are coupled to one and the other of the power supply voltage corresponding to "H" level of data and ground voltage GND corresponding to "L" level of data, respectively. Thus, data can be held within the memory cell during stand-by, without performing a refresh operation by periodically turning on word line WLA. As word line WLB is also similar to WLA, detailed description thereof will not be repeated.

Figure 3:
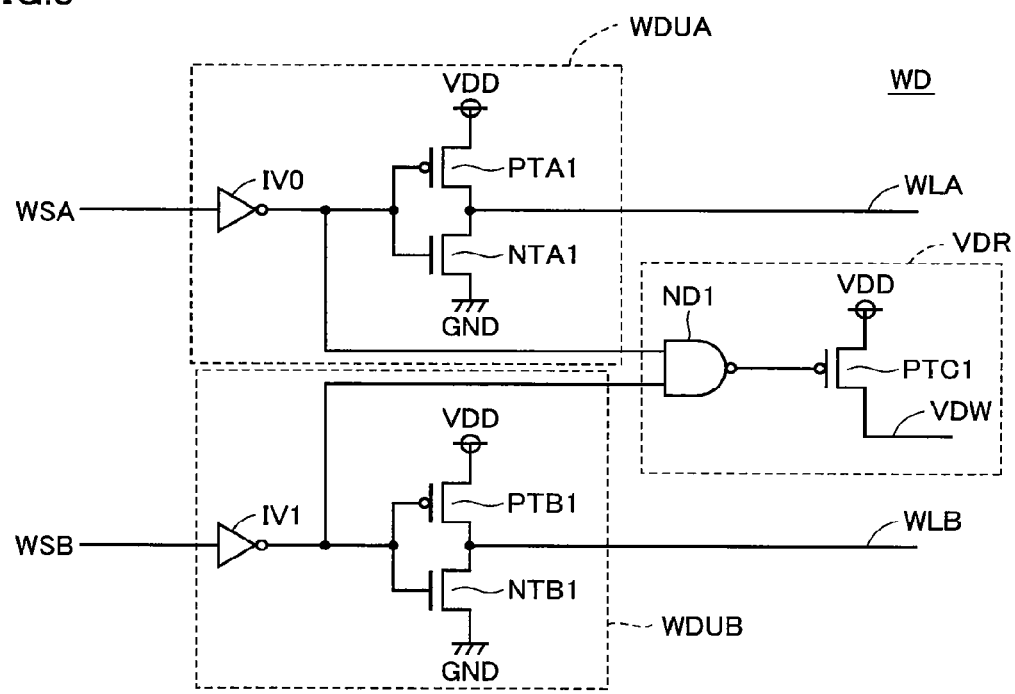
FIG. 3 is a circuit configuration diagram of a word driver WD according to the first embodiment of the present invention.

FIG. 3 is a circuit configuration diagram of word driver WD according to the first embodiment of the present invention.

Referring to FIG. 3, word driver WD according to the first embodiment of the present invention includes a word driver unit WDUA provided in correspondence with word line WLA, a word driver unit WDUB provided in correspondence with word line WLB, and a power supply line unit VDR driving power supply line VDW.

Word driver unit WDUA includes an inverter IV0, a P-channel MOS transistor PTA1, and an N-channel MOS transistor NTA1.

Word driver unit WDUB includes an inverter IV1, a P-channel MOS transistor PTB1, and an N-channel MOS transistor NTB1.

Transistor PTA1 is arranged between a power supply voltage VDD and word line WLA, and the gate of transistor PTA1 receives an input of an inverted signal of a decode signal WSA through inverter IV0. Transistor NTA1 is arranged between ground voltage GND and word line WLA and the gate of transistor NTA1 receives an input of the inverted signal of decode signal WSA through inverter IV0.

Transistor PTB1 is arranged between power supply voltage VDD and word line WLB, and the gate of transistor PTB1 receives an input of an inverted signal of a decode signal WSB through inverter IV1. Transistor NTB1 is arranged between ground voltage GND and word line WLB and the gate of transistor NTB1 receives an input of the inverted signal of decode signal WSB through inverter IV1.

Power supply line unit VDR includes an NAND circuit ND1 and a P-channel MOS transistor PTC1. Receiving inputs of the inverted signal of decode signal WSA and the inverted signal of decode signal WSB, NAND circuit ND1 outputs a result of NAND logic operation to the gate of transistor PTC1. Transistor PTC1 is provided between power supply voltage VDD and power supply line VDW and the gate thereof receives an input of NAND circuit ND1.

An operation of word driver WD according to the first embodiment of the present invention will now be described.

Decode signals WSA, WSB for ports PA and PB are set to "L" level in a normal, inactivated state and set to "H" level in an activated state.

Accordingly, for example, when decode signal WSA for port PA is set to "H" level in word driver unit WDUA, transistor PTA1 is turned on, word line WLA makes transition from the "L" level in the initial state to "H" level, and word line WLA is activated. When decode signal WSA is at "L" level, transistor NTA1 is turned on, and therefore, word line WLA is set to "L" level.

Similarly, when decode signal WSB for port PB is set to "H" level in word driver unit WDUB, transistor PTB1 is turned on, word line WLB makes transition from "L" level in the initial state to "H" level, and word line WLB is activated. When decode signal WSB is at "L" level, transistor NTB1 is turned on, and therefore, word line WLB is set to "L" level.

When row addresses different from each other are selected at ports PA and PB (hereinafter, also simply referred to as different-row-access), a voltage level of one of word lines WLA and WLB is driven to "H" level (voltage VDD level).

Then, an example where row addresses in the same row are simultaneously selected at ports PA and PB (hereinafter also simply referred to as identical-row-access) is considered. Here, decode signals WSA and WSB are both set to "H" level. In the present example, for the sake of simplicity of description, the example where row addresses in the same row are simultaneously selected will be described. Identical-row-access in the subject application, however, is not limited to the example where row addresses in the same row are simultaneously selected, but also it encompasses an example where access periods during which the same row is accessed overlap with each other even though row addresses in the same row are selected at different timing.

Here, power supply line unit VDR will be described. As decode signals WSA, WSB for ports PA and PB are at "L" level in the normal, inactivated state, the output signal of NAND circuit ND1 here is at "L" level, transistor PTC1 is turned on, and power supply voltage VDD is electrically coupled to power supply line VDW. Namely, power supply line VDW is set to a state precharged to power supply voltage VDD.

On the other hand, when any one of decode signals WSA, WSB for ports PA and PB is activated to "H" level, the output signal of NAND circuit ND1 attains to "H" level, transistor PTC1 is turned off, and power supply line VDW is set to an open state.

Figure 4:
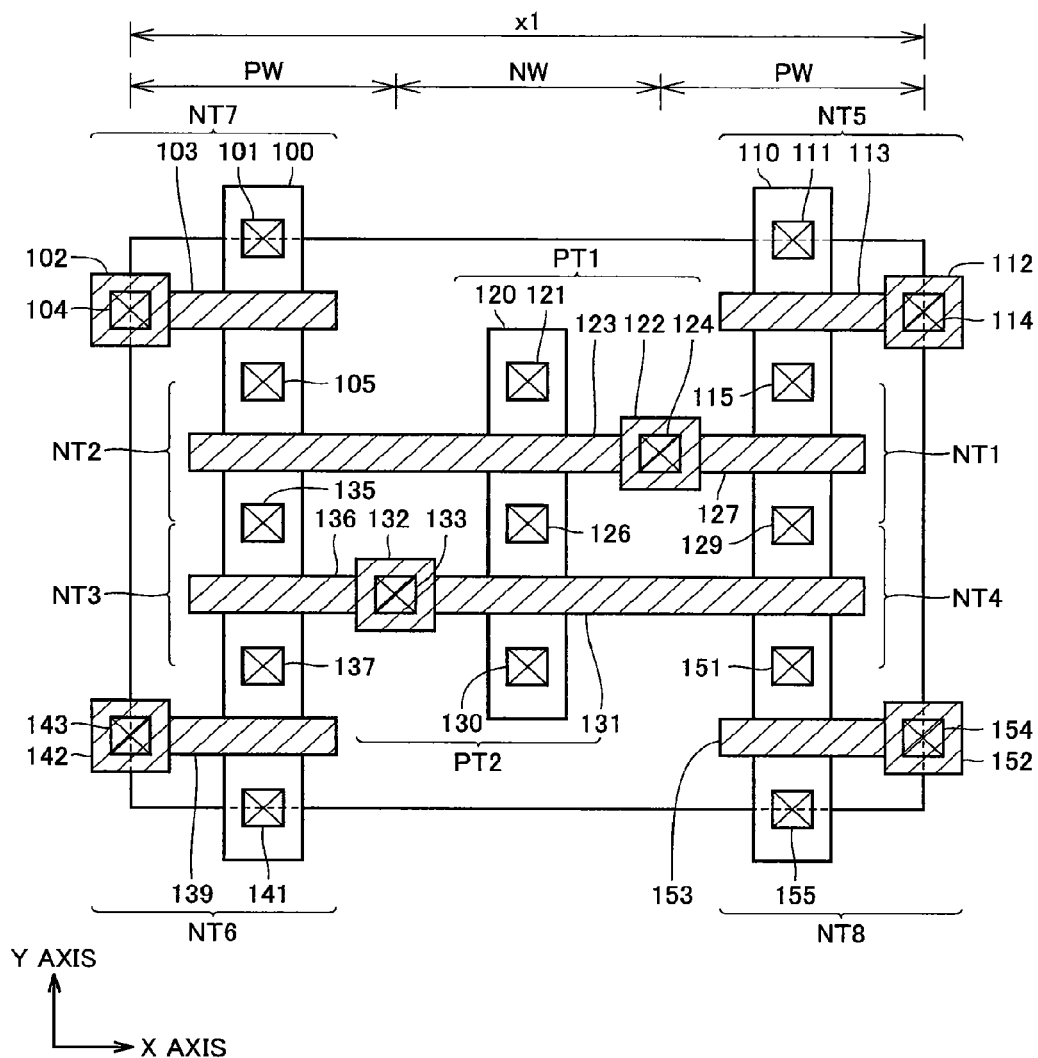
FIG. 4 is a detailed diagram illustrating a layout structure of a lower region of memory cell MC according to the first embodiment of the present invention.

FIG. 4 is a detailed diagram illustrating a layout structure of a lower region of memory cell MC according to the first embodiment of the present invention. Here, layers up to a first metal interconnection layer are shown.

Referring to FIG. 4, memory cell MC according to the first embodiment of the present invention includes ten transistors as described above. Specifically, memory cell MC includes transistors NT1 to NT8 and transistors PT1 and PT2.

Here, a layout of a transistor will be described. In the present example, N-channel MOS transistors are formed on opposing sides in P-type well structures (PW), and P-channel MOS transistors are formed therebetween in an N-type well structure (NW).

A diffusion layer serving as a source region and a drain region of each transistor is formed along a y-axis direction with respect to a substrate.

Specifically, a diffusion layer 100 of transistors NT7, NT2, NT3, and NT6 is formed along the y-axis direction. In addition, a diffusion layer 120 of transistors PT1 and PT2 is formed. Moreover, a diffusion layer 110 of transistors NT5, NT1, NT4, NT8 is formed.

Diffusion layer 100 is divided by gate regions of four transistors NT7, NT2, NT3, and NT6 to form source/drain regions. Diffusion layer 120 is divided by gate regions of two transistors PT1 and PT2 to form source/drain regions. Diffusion layer 110 is divided by the gate regions of four transistors NT5, NT1, NT4, and NT8 to form source/drain regions.

A gate polysilicon gate implementing the gate region of transistors NT1 to NT6 and PT1 and PT2 is formed along an x-axis direction.

Diffusion layer 100 of transistor NT7 is divided by a polysilicon gate 103 into the source region and the drain region, that are electrically coupled to an upper metal through provided contacts 101 and 105 respectively. In addition, in the gate region, a gate electrode 102 is provided above polysilicon gate 103 of transistor NT7. Gate electrode 102 is electrically coupled to the upper metal through a contact 104.

In addition, diffusion layer 100 of transistor NT2 is divided into the source region and the drain region by a polysilicon gate 123, and electrically coupled to the upper metal through provided contacts 105 and 135 respectively. Contact 105 is provided as a contact common to transistors NT7 and NT2. In addition, a gate electrode 122 common to transistors PT1 and NT5 which will be described later is provided above polysilicon gate 123 of transistor NT2. Gate electrode 124 is electrically coupled to the upper metal through a contact 124. It is noted that polysilicon gate 123 is formed astride diffusion layers 100, 120 and 110.

Diffusion layer 100 of transistor NT3 is divided into the source region and the drain region by a polysilicon gate 136, that are electrically coupled to the upper metal through provided contacts 135 and 137 respectively. Contact 135 is provided as a contact common to transistors NT2 and NT3. In addition, a gate electrode 132 common to transistors PT2 and NT4 which will be described later is provided above polysilicon gate 136 of transistor NT3. Gate electrode 132 is electrically coupled to the upper metal through a contact 133. It is noted that polysilicon gate 136 is formed astride diffusion layers 100, 120 and 110.

Diffusion layer 100 of transistor NT6 is divided into the source region and the drain region by a polysilicon gate 139, that are electrically coupled to the upper metal through provided contacts 137 and 141 respectively. Contact 137 is provided as a contact common to transistors NT6 and NT3. In addition, a gate electrode 142 is provided above the polysilicon gate of transistor NT6. Gate electrode 142 is electrically coupled to the upper metal through a contact 143.

Diffusion layer 120 of transistor PT1 is divided into the source region and the drain region by polysilicon gate 123, that are electrically coupled to the upper metal through provided contacts 126 and 121 respectively. Gate electrode 122 of transistor PT1 is provided above polysilicon gate 123, and it is configured to be shared by transistors NT2 and NT1 as described above.

Diffusion layer 120 of transistor PT2 is divided into the source region and the drain region by polysilicon gate 136, that are electrically coupled to the upper metal through provided contacts 126 and 130 respectively. Gate electrode 133 of transistor PT2 is provided above polysilicon gate 136, and it is configured to be shared by transistors NT3 and NT4 as described above. In addition, contact 126 is provided as a contact common to transistors PT1 and PT2.

Diffusion layer 110 of transistor NT5 is divided into the source region and the drain region by a polysilicon gate 113, that are electrically coupled to the upper metal through provided contacts 111 and 115 respectively. A gate electrode 112 is provided above polysilicon gate 113 of transistor NT5. Gate electrode 112 is electrically coupled to the upper metal through a contact 114.

Diffusion layer 110 of transistor NT1 is divided into the source region and the drain region by polysilicon gate 123, that are electrically coupled to the upper metal through provided contact 129 and contact 115 respectively. Gate electrode 122 of transistor NT1 is provided above polysilicon gate 123, and it is configured to be shared by transistors NT2 and PT1 as described above. In addition, contact 115 is provided as a contact common to transistors NT5 and NT1.

Diffusion layer 110 of transistor NT4 is divided into the source region and the drain region by polysilicon gate 136, that are electrically coupled to the upper metal through provided contact 129 and contact 115 respectively. Gate electrode 132 of transistor NT4 is provided above polysilicon gate 136, and it is configured to be shared by transistors NT3 and PT2 as described above. In addition, contact 129 is provided as a contact common to transistors NT1 and NT4.

Diffusion layer 110 of transistor NT8 is divided into the source region and the drain region by a polysilicon gate 153, that are electrically coupled to the upper metal through provided contact 151 and contact 155 respectively. A gate electrode 152 is provided above polysilicon gate 153 of transistor NT8. Gate electrode 152 is electrically coupled to the upper metal through a contact 154.

Here, such a configuration layout is shown that a shape of diffusion layers 100 and 110 forming transistors NT1 to NT8 provided along the y-axis direction is linear and a width of the diffusion layers is uniform.

Figure 5:
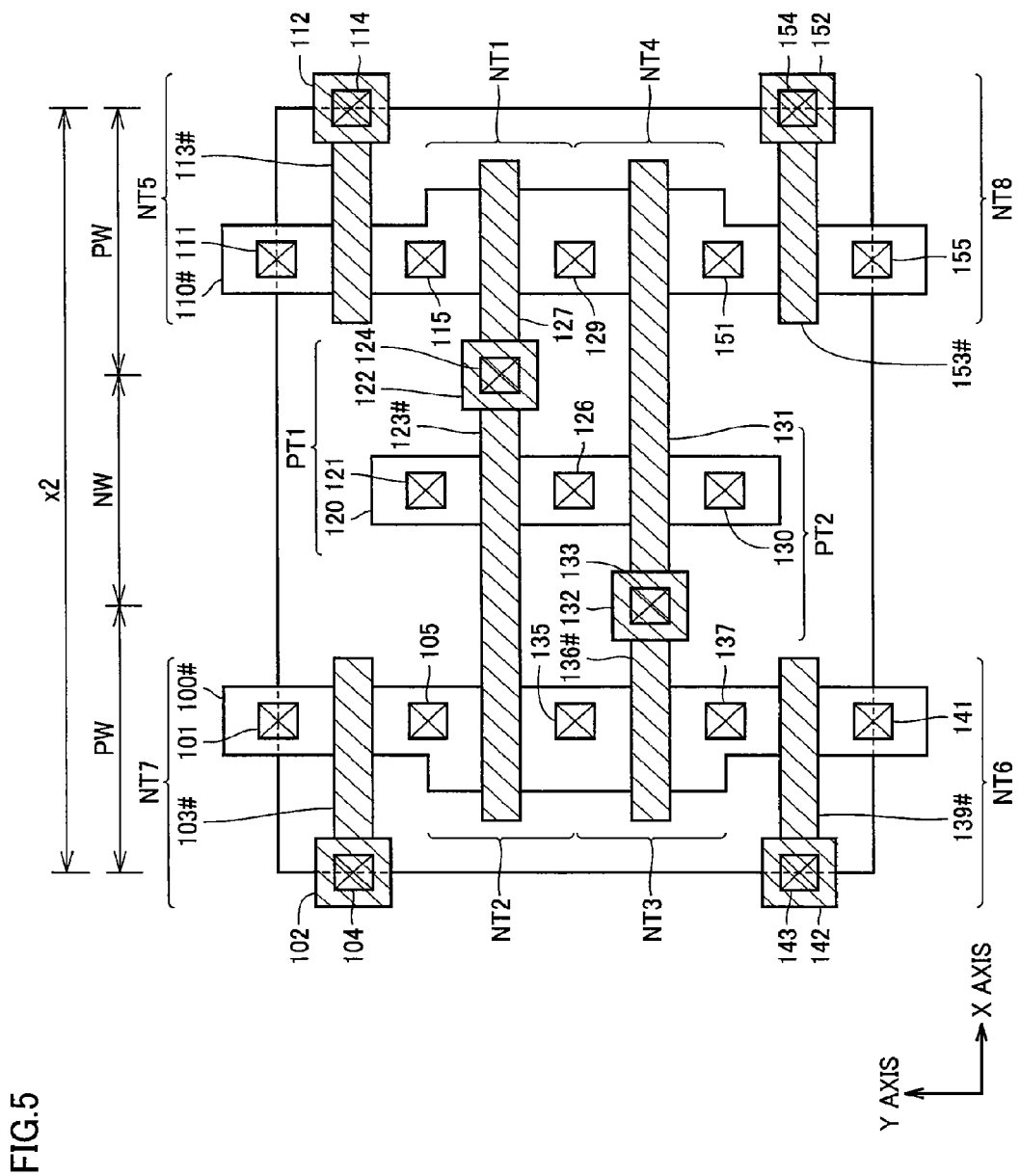
FIG. 5 is a detailed diagram illustrating a layout structure of a lower region of a conventional memory cell MC used as a comparative example.

FIG. 5 is a detailed diagram illustrating a layout structure of a lower region of a conventional memory cell MC used as a comparative example. Here, layers up to the first metal interconnection layer are shown.

FIG. 5 is different from FIG. 4 in that diffusion layers 100 and 110 are replaced with diffusion layers 100# and 110# and polysilicon gates 103, 113, 123, 136, 139, and 153 are replaced with polysilicon gates 103#, 113#, 123#, 136#, 139#, and 153# respectively. As the configuration is otherwise the same, detailed description thereof will not be repeated.

The configuration shown in FIG. 5 shows an example where a width of transistors NT2 and NT3 forming driver transistors in diffusion layer 100# is substantially twice as large as that of diffusion layer 100. Similarly, an example where a width of transistors NT1 and NT4 forming driver transistors in diffusion layer 1103 is substantially twice as large as that of diffusion layer 100 is shown. Accordingly, polysilicon gates 103#, 113#, 123#, 136#, 139#, and 153# provided astride diffusion layers 100# and 110# should also be designed to have a length larger than polysilicon gates 103, 113, 123, 136, 139, and 153, with the increase in the width of the diffusion layers. Namely, a length x2 of single memory cell MC in the x-axis direction according to the conventional configuration should be designed to be greater than a length x1 of memory cell MC according to the first embodiment of the present invention.

In a case of an SRAM memory cell having dual ports as described above, according to the conventional design of the SRAM memory cell, as an approach to improve SNM, SNM has been ensured by making greater a size of a driver transistor (NT2, NT3, NT1, NT4), which is an N-channel MOS transistor implementing an inverter of a flip-flop circuit, than an access transistor electrically coupled to a word line in the same row.

Therefore, in the configuration of the conventional dual-port SRAM memory cell, the size of the driver transistor should be made larger and the cell area increases as a whole.

In contrast, the memory cell according to the first embodiment of the present invention adopts a scheme capable of ensuring SNM without increasing a size of a driver transistor as will be described later. Therefore, a dual-port SRAM memory cell smaller in a cell area than a conventional memory cell can be obtained.

Figure 6:
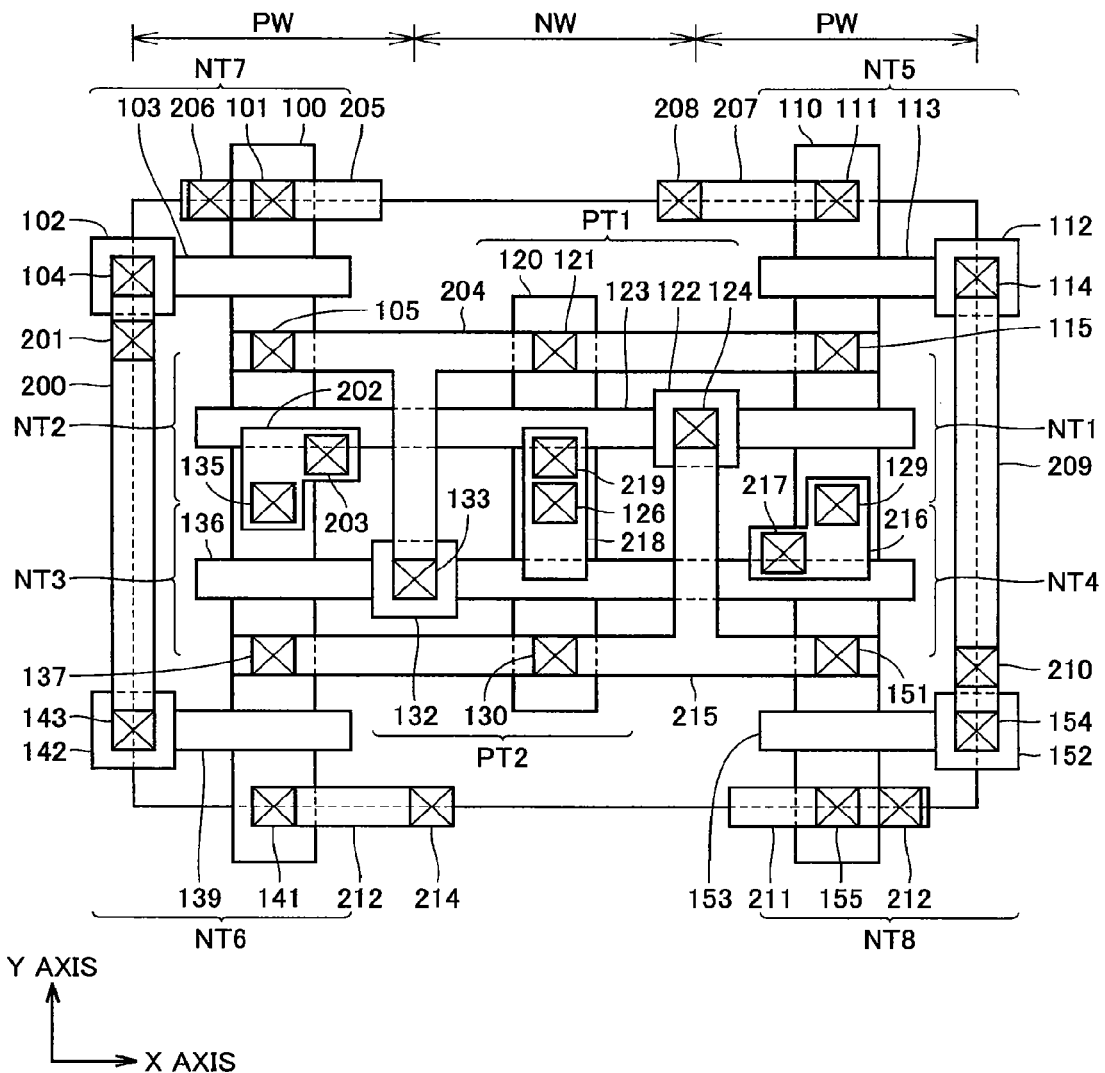
FIG. 6 is a detailed diagram illustrating a layout structure when a first metal interconnection layer in an upper region of memory cell MC according to the first embodiment of the present invention is formed.

FIG. 6 is a detailed diagram illustrating a layout structure when the first metal interconnection layer in an upper region of memory cell MC according to the first embodiment of the present invention is formed.

Referring to FIG. 6, a metal 200 electrically coupling gate electrodes of transistors NT7 and NT6 through contact 104 and contact 143 respectively is provided. Metal 200 is electrically coupled to an upper (second-layer) metal through a contact 201.

In addition, a metal 205 electrically coupled to contact 101 provided in the source region of transistor NT7 and electrically coupled to the upper (second-layer) metal through a contact 206 is provided.

Moreover, a metal 204 is electrically coupled to transistors NT2, PT1, and NT5 and NT1 through contacts 105, 121, and 115, respectively, and electrically coupled to contact 133 of gate electrode 132 of transistors NT3, PT2, and NT4 through contact 133. Namely, metal 204 forms a region corresponding to node Nd0.

Further, a metal 215 is electrically coupled to transistors NT6, PT2, and NT4 and NT8 through contacts 137, 130, and 151, respectively, and electrically coupled to contact 124 of gate electrode 122 of transistors NT2, PT1, and NT1 through contact 124. Namely, metal 215 forms a region corresponding to node Nd1.

In addition, a metal 207 electrically coupled to contact 111 provided in the source region of transistor NT5 and electrically coupled to the upper metal through a contact 208 is provided. A metal 209 electrically coupling gate electrodes of transistors NT5 and NT8 through contacts 114 and 154 respectively is provided. Metal 209 is electrically coupled to the upper (second-layer) metal through a contact 210.

Moreover, a metal 211 electrically coupled to contact 155 provided in the source region of transistor NT8 and electrically coupled to the upper metal through a contact 212 is provided. Further, a metal 212 electrically coupled to contact 141 provided in the source region of transistor NT6 and electrically coupled to the upper metal through a contact 214 is provided.

In addition, a metal 202 electrically coupled to contact 135 common to transistors NT2 and NT3 and electrically coupled to the upper metal through a contact 203 is provided. Moreover, a metal 216 electrically coupled to contact 129 common to transistors NT1 and NT4 and electrically coupled to the upper metal through a contact 217 is provided. Further, a metal 218 electrically coupled to contact 126 common to transistors PT1 and PT2 and electrically coupled to the upper metal through a contact 219 is provided.

Figure 7:
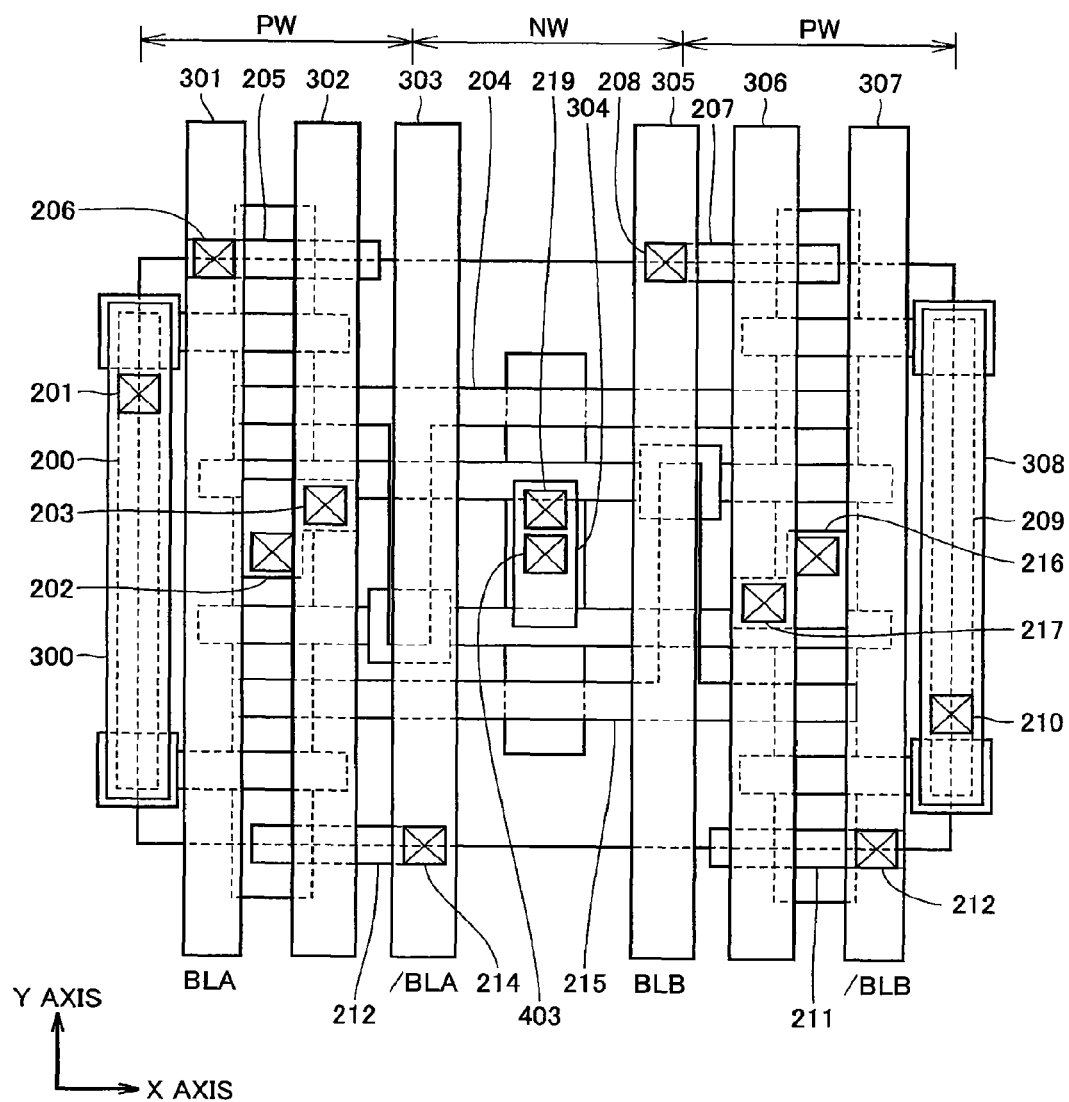
FIG. 7 is a detailed diagram illustrating a layout structure when a second metal interconnection layer in the upper region of memory cell MC according to the first embodiment of the present invention is formed.

FIG. 7 is a detailed diagram illustrating a layout structure when a second metal interconnection layer in the upper region of memory cell MC according to the first embodiment of the present invention is formed.

Referring to FIG. 7, here, a metal is provided along the y-axis direction. Specifically, a metal 301 electrically coupled through contact 206, a metal 302 electrically coupled through contact 203, a metal 303 electrically coupled through contact 214, a metal 304 electrically coupled through contact 219, a metal 305 electrically coupled through contact 208, a metal 306 electrically coupled through contact 217, a metal 307 electrically coupled through contact 212, and a metal 308 electrically coupled through contact 210 are provided.

Metals 301 and 303 are used as bit lines BLA, /BLA described in connection with FIG. 2. In addition, metals 305 and 307 are used as bit lines BLB, /BLB. Metals 302 and 306 are electrically coupled to a voltage supply line supplying ground voltage GND, which will be described later.

Figure 8:
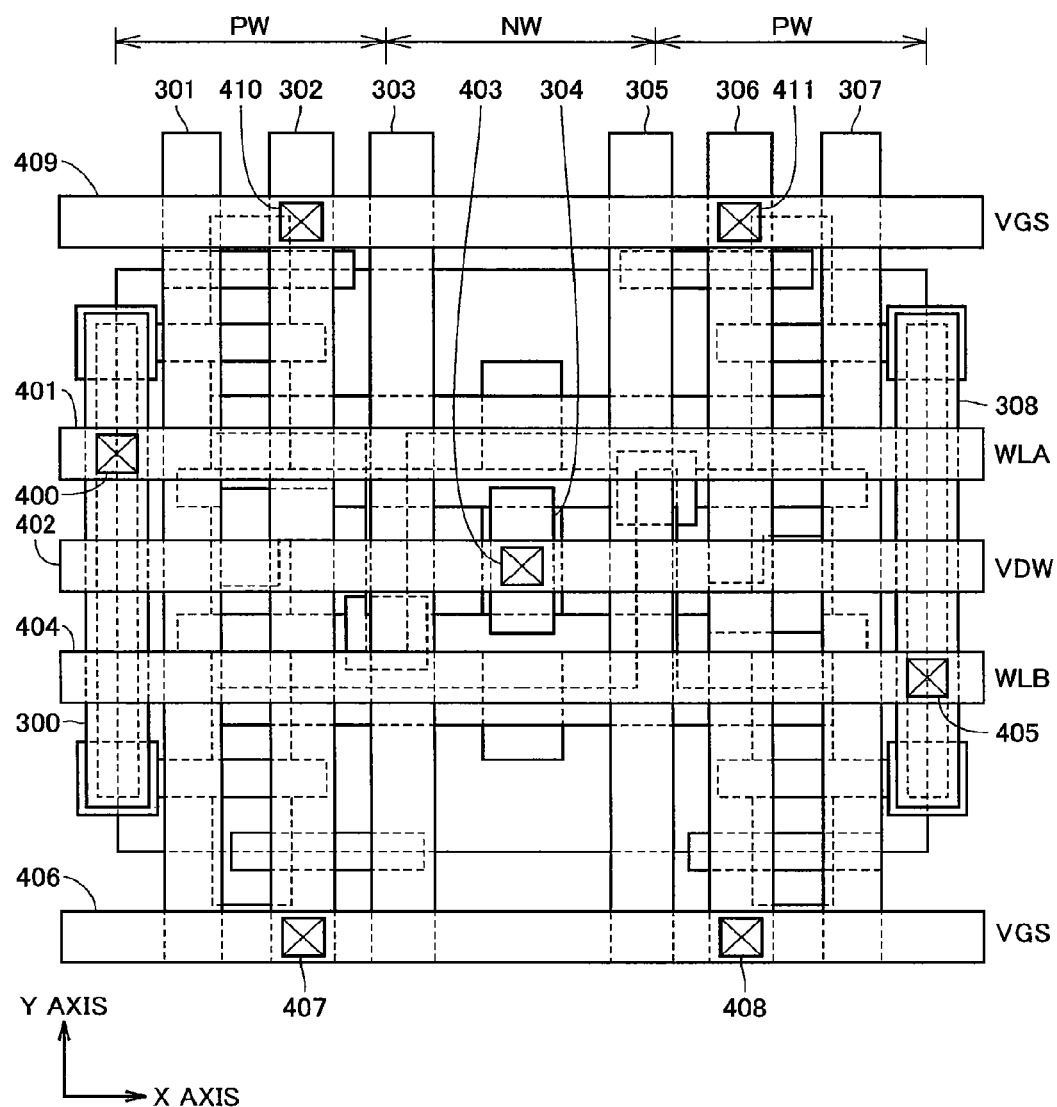
FIG. 8 is a detailed diagram illustrating a layout structure when a third metal interconnection layer in the upper region of memory cell MC according to the first embodiment of the present invention is formed.

FIG. 8 is a detailed diagram illustrating a layout structure when a third metal interconnection layer in the upper region of memory cell MC according to the first embodiment of the present invention is formed.

Referring to FIG. 8, here, a metal is provided along the x-axis direction. Specifically, a metal 409 electrically coupled to metals 302 and 306 through contacts 410 and 411 respectively, a metal 401 electrically coupled to metal 300 through a contact 400, a metal 402 electrically coupled to metal 304 through a contact 403, a metal 404 electrically coupled to metal 308 through a contact 405, and a metal 406 electrically coupled to metals 302 and 306 through contacts 407 and 408 respectively are provided.

Metals 401 and 404 are used as word lines WLA, WLB described in connection with FIG. 2, respectively. In addition, metal 402 is used as power supply line VDW supplying power supply voltage VDD described above. Metals 406 and 409 are used as a voltage supply line VGS supplying ground voltage GND.

As shown in the configuration, the power supply line supplied with power supply voltage VDD supplied as the operation voltage of memory cell MC is provided between word lines WLA and WLB and adjacent to word lines WLA and WLB. As described above, word lines WLA, WLB and power supply line VDW supplying power supply voltage VDD are formed in an identical metal interconnection layer (third layer).

Figure 9:
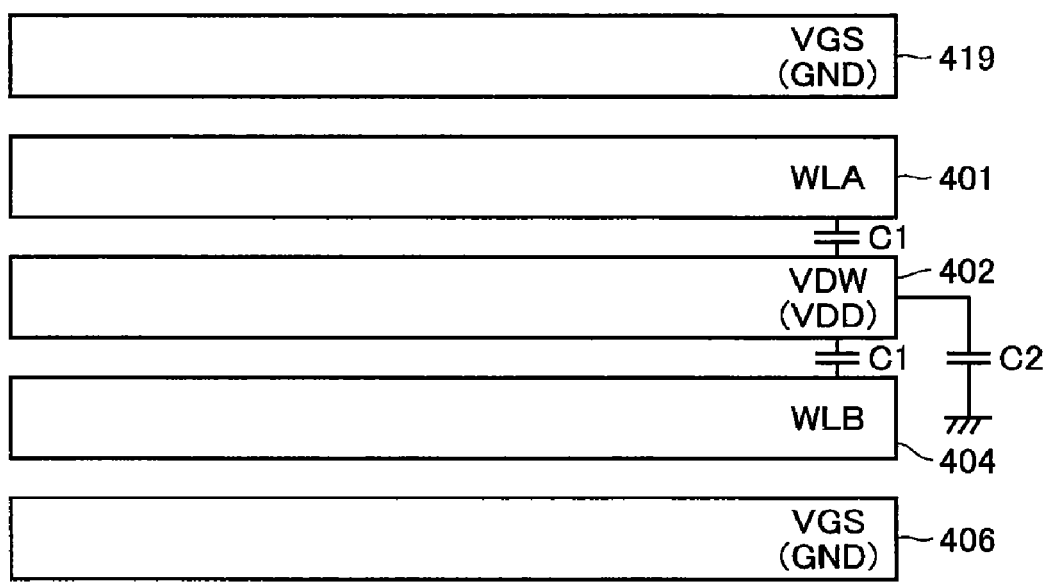
FIG. 9 is a diagram illustrating relation between a word line and a power supply line based on a layout configuration according to the first embodiment of the present invention.

FIG. 9 is a diagram illustrating relation between the word line and the power supply line based on the layout configuration according to the first embodiment of the present invention.

As shown in FIG. 9, when a power supply line is provided adjacent to and between word lines WLA and WLB, a coupling capacitance acts between word lines WLA, WLB and power supply line VDW. A potential level of power supply line VDW is raised during access due to the influence of the coupling capacitance. As described above, during access, power supply line VDW is in a state precharged to power supply voltage VDD and set to an open state.

For example, a coupling capacitance that acts between word lines WLA and WLB is denoted as C1. In addition, a capacitance with respect to the ground of power supply line 402 is denoted as C2.

Then, an amount of charges Q stored in power supply line 402 is expressed in the following equation.

$$Q = C1 \times (V_a - V_{WLA}) + C1 \times (V_a - V_{WLB}) + C2 \times V_a \quad (1)$$

$V_a$: voltage value of VDW, $V_{WLB}$: voltage value of word line WLA $V_{WLB}$: voltage value of word line WLB FIG. 10 is a diagram illustrating voltage increase in the power supply line during different-row-access and identical-row-access.

FIG. 10(a) shows voltage increase in the power supply line during different-row-access.

For example, a case where word line WLA is selected is shown here. It is assumed here that word line WLB accesses a different row.

During a period t1, as an access state has not yet been established, word line WLA is set to "L" level, that is, 0V. On the other hand, power supply line VDW is set to the power supply voltage VDD level. When word line WLA is selected during a period t2, the potential level of power supply line VDW is raised due to the coupling capacitance from word line WLA and a voltage Vd1 higher than power supply voltage VDD is set.

Amount of charges Q during this period t1 is expressed in the following equation.

$$Q = 2 \times C1 + C2) \times VDD$$

$$V_a = VDD, V_{WLA} = V_{WLB} = 0 \quad (2)$$

Next, amount of charges Q during period t2 is expressed in the following equation.

$$Q = (2 \times C1 + C2) \times Vd1 - C1 \times VDD$$

$$V_a = Vd1, V_{WLA} = VDD, V_{WLB} = 0 \quad (3)$$

FIG. 10(b) shows voltage increase in the power supply line during identical-row-access.

For example, a case where word lines WLA and WLB are both selected is shown here.

Period t1 is similar to the above. When word lines WLA and WLB are both selected during period t2, the potential level of power supply line VDW is raised due to the coupling capacitance from word lines WLA and WLB and a voltage Vd2 higher than voltage Vd1 is set.

Amount of charges Q during this period t2# is expressed in the following equation.

$$Q = (2 \times C1 + C2) \times Vd2 - 2 \times C1 \times VDD$$

$$V_a = Vd2, V_{WLA} = V_{WLB} = VDD \quad (4)$$

Summarizing the above, the following equations are obtained.

From Equations (2) and (3), $$Vd1 = \frac{3C1 + C2}{2C1 + C2} \times VDD$$

(during different-row-access)

From Equations (2) and (4), $$Vd2 = \frac{4C1 + C2}{2C1 + C2} \times VDD$$

(during identical-row-access)

Here, when a line width of word lines WLA, WLB is set to 0.1 μm and a line width of power supply line VDW is set to 0.1 μm for example in 90 nm generation, coupling capacitances C1 and C2 are assumed as 1 fF and 10 fF respectively. Then, voltages Vd1 and Vd2 in the equations above are expressed in the following equations. It is noted here that power supply voltage VDD is set to 1V.

$$Vd1 = \frac{13}{12} \times 1.0 = 1.083 \text{V} (+83 \text{mV})$$

$$Vd2 = \frac{14}{12} \times 1.0 = 1.167 \text{V} (+167 \text{mV})$$

Therefore, in the layout configuration according to the first embodiment of the present invention, the potential level is raised from a normal value, for example, by 10% or greater.

Figure 11:
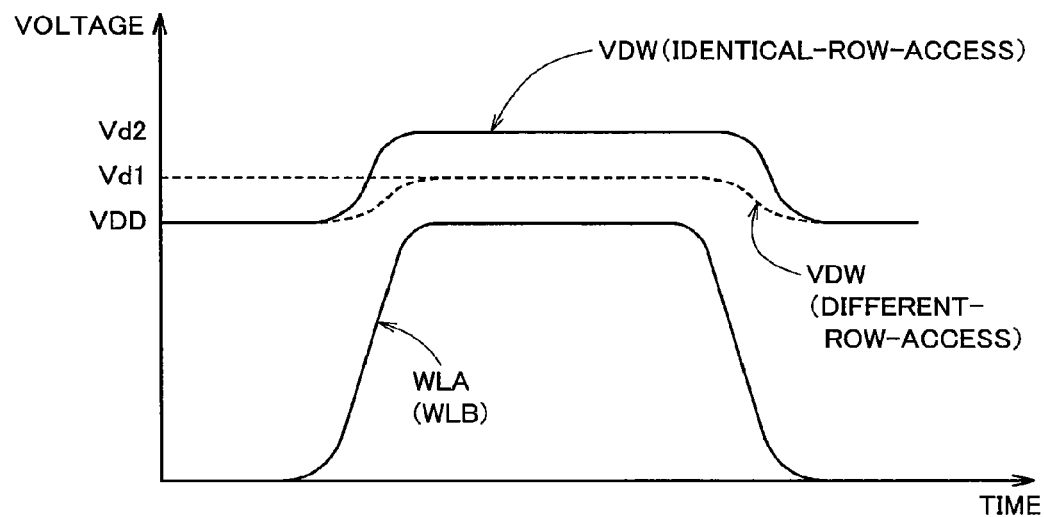
FIG. 11 is a diagram illustrating voltage relation between a power supply line VM and word lines WLA, WLB in identical-row-access and different-row-access according to the first embodiment of the present invention.

FIG. 11 is a diagram illustrating voltage relation between a power supply line VM and word lines WLA, WLB in identical-row-access and different-row-access according to the first embodiment of the present invention.

As shown in FIG. 11, in the case of different-row-access, the potential level of power supply line VDW is raised to voltage Vd1 due to the influence of the coupling capacitance, and in the case of identical-row-access, the potential level of power supply line VDW is raised to voltage Vd2 due to the influence of the coupling capacitance.

Figure 12:
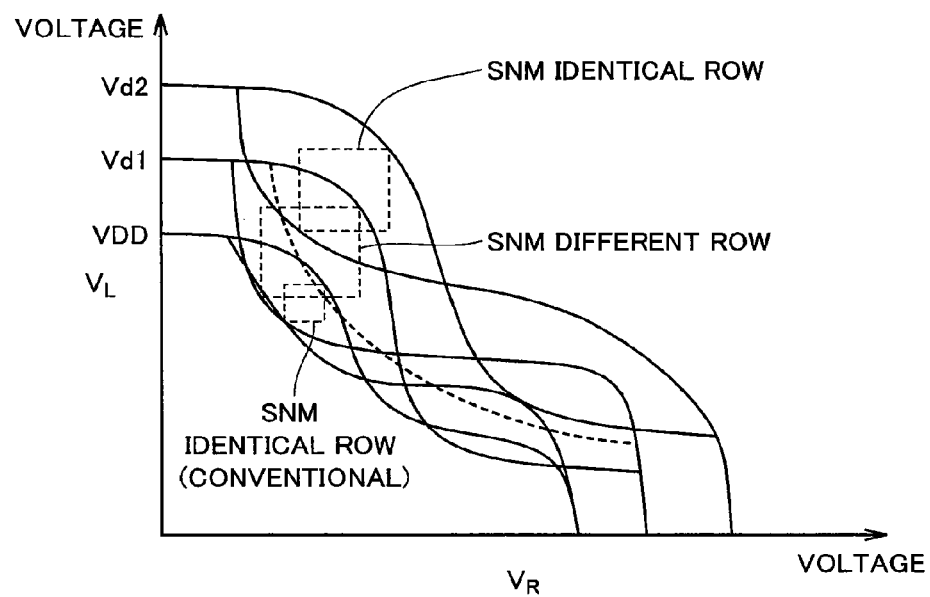
FIG. 12 is a diagram illustrating static noise margin according to the first embodiment of the present invention.

FIG. 12 is a diagram illustrating static noise margin according to the first embodiment of the present invention.

As shown in FIG. 12, in the conventional configuration, in an operation upon receiving supply of power supply voltage VDD, sufficient margin for SNM cannot be ensured when identical-row-access is carried out. On the other hand, according to the layout configuration of the first embodiment of the present invention, the voltage level of power supply line VDW can be raised by the coupling capacitance of the word line. Therefore, in different-row-access, the margin for SNM can be improved as compared with conventional different-row-access. In addition, even in the case of identical-row-access, as the potential level of power supply line VDW can be raised as illustrated, SNM as great as in different-row-access can be ensured. Namely, sufficient margin for SNM can be ensured.

In other words, according to the configuration of the subject application, even when a size or the like of the driver transistor is not made larger, deterioration of SNM with the increase in the power supply voltage can be suppressed during access to the same memory cell row. In addition, SNM can further be improved also during access to a different memory cell row.

In addition, as the size or the like of the driver transistor is not made larger, a cell area of the memory cell is reduced and the entire layout area can be reduced.

(Second Embodiment)

In the first embodiment above, the configuration in which data reading and writing is performed by using bit line pair BLA for port PA and bit line pair BLB for port PB for sense amplifier/write driver 15a and sense amplifier/write driver 15b respectively has been described. Namely, the configuration for performing data reading and writing by using independent bit line pairs respectively has been described.

In the present second embodiment, for example, a configuration in which data reading and data writing can be performed by using bit line pair BLA also for sense amplifier/write driver 15b will be described. Though data reading will be described here, the configuration is also similarly applicable to data writing.

Figure 13:
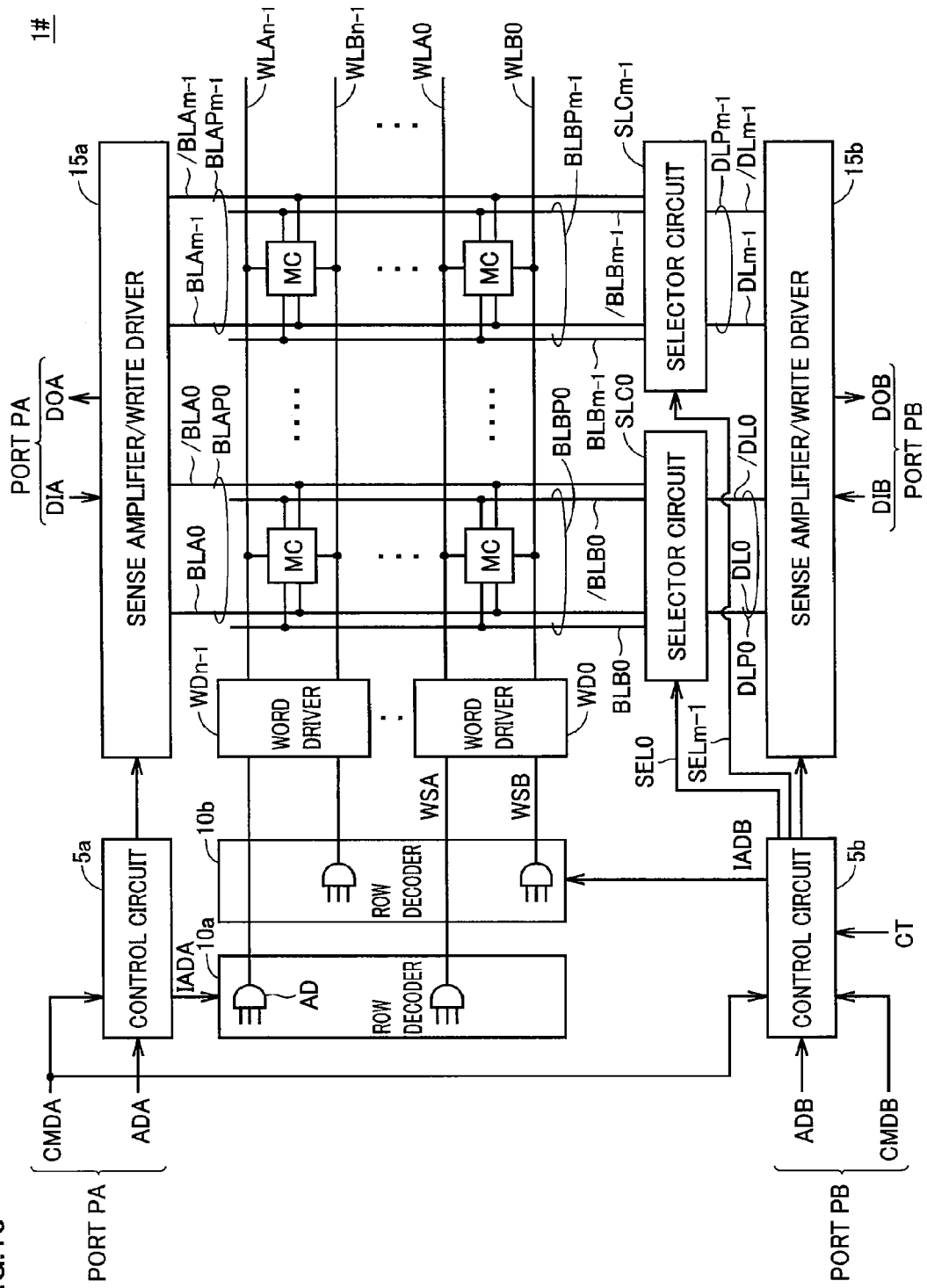
FIG. 13 is a schematic block diagram of a semiconductor memory device 1# according to a second embodiment of the present invention.

FIG. 13 is a schematic block diagram of a semiconductor memory device 1# according to the second embodiment of the present invention.

Referring to FIG. 13, semiconductor memory device 1# according to the second embodiment of the present invention is different from semiconductor memory device 1 described in connection with FIG. 1 in that a data line pair DLP and a selector circuit SLC each corresponding to the memory cell column are provided. As the semiconductor memory device is otherwise the same as semiconductor memory device 1 described in connection with FIG. 1, detailed description thereof will not be repeated. It is noted that data line pair DLP includes data lines DL, /DL. In the present example, a data line pair DLP0 and a data line pair DLPm−1 are shown.

In the present example, word driver WD will be described assuming that it is configured similarly to the first embodiment, however, the configuration is not limited as such. The configuration may be such that solely word driver units WDUA and WDUB described in connection with FIG. 3 are provided without power supply line unit VDR. Here, it is assumed that power supply line VDW supplying the power supply voltage to memory cell MC is connected to power supply voltage VDD in a fixed manner.

Figure 14:
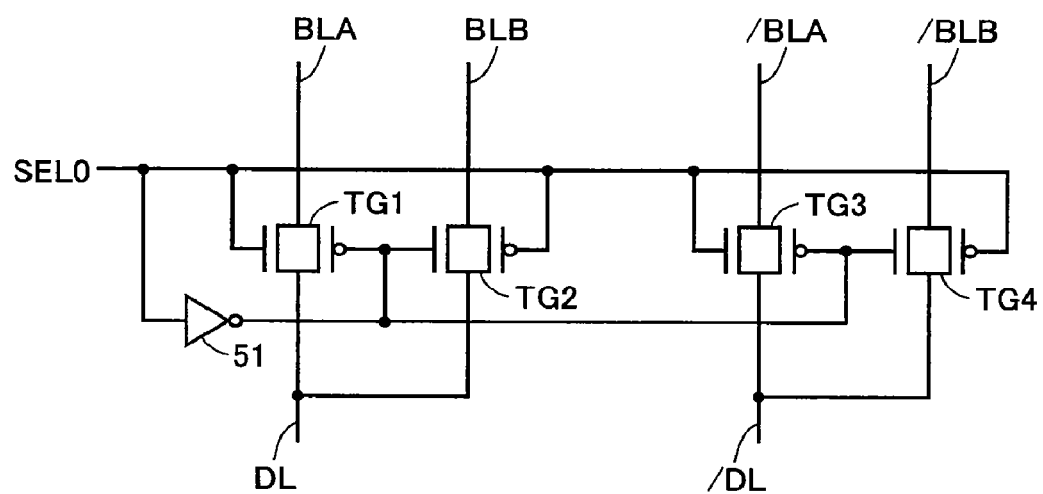
FIG. 14 is a circuit configuration diagram of a selector circuit SLC according to the second embodiment of the present invention.

FIG. 14 is a circuit configuration diagram of selector circuit SLC according to the second embodiment of the present invention.

Referring to FIG. 14, selector circuit SLC according to the second embodiment of the present invention includes transfer gates TG1 to TG4 and an inverter 51.

Transfer gates TG1 and TG2 are connected in parallel between bit lines BLA, BLB and data line DL, respectively. Transfer gates TG3 and TG4 are connected in parallel between bit lines /BLA, /BLB and data line /DL, respectively.

Transfer gates TG1 and TG2 receive an input of a control signal SEL0 and an inverted signal thereof through inverter 51. Transfer gates TG3 and TG4 also operate similarly to transfer gates TG1 and TG2. Namely, selector circuit SLC according to the second embodiment of the present invention switches a state of connection of data line DL to connection thereof with any one of bit line pair BLAP and bit line pair BLBP, in accordance with the input of control signal SEL0.

Therefore, when control signal SEL0 is at "L" level, bit line pair BLBP for port PB is electrically connected to sense amplifier/write driver 15b through data line pair DLP as in a normal operation. On the other hand, when control signal SEL0 is at "H" level, bit line pair BLAP for port PA is electrically connected to sense amplifier/write driver 15b through data line pair DLP.

It is noted here that control signal SEL is output from control circuit 5b based on control information CT. Here, it is assumed that control signals SEL0 to SELm−1 are output from control circuit 5b to selector circuits SLC0 to SLCm−1 respectively.

Figure 15:
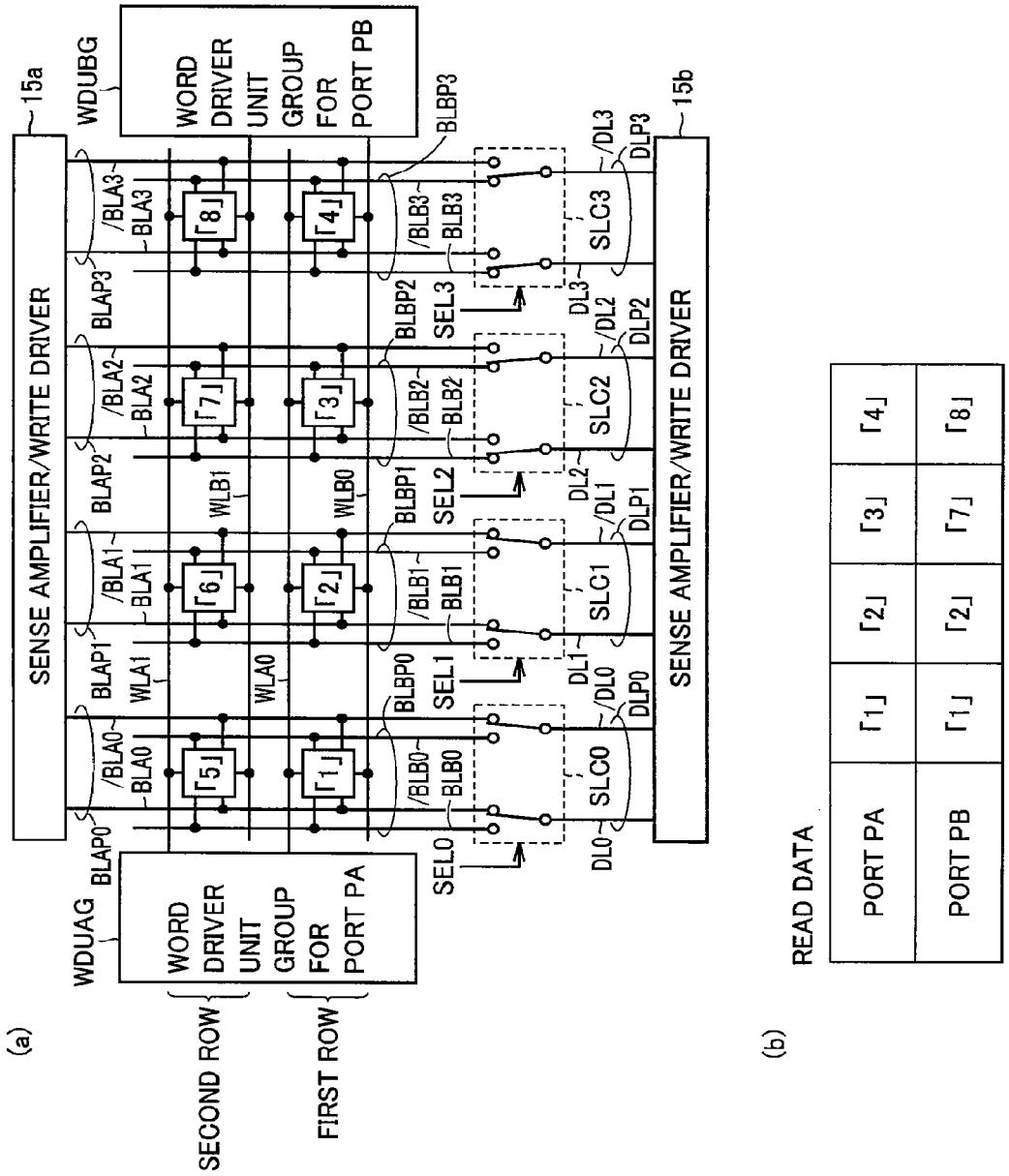
FIG. 15 is a diagram illustrating an example where semiconductor memory device 1# according to the second embodiment of the present invention operates.

FIG. 15 is a diagram illustrating an example where semiconductor memory device 1# according to the second embodiment of the present invention operates.

Referring to FIG. 15(a), in the present example, a memory array configured with two memory cell rows and four memory cell columns is shown by way of example.

In addition, word driver unit groups WDUAG, WDUAG constituted of word driver units WDUA or WDUB driving word line WLA or WLB are provided on opposing sides of the memory array. As word driver unit WDUA or WDUB is as described in connection with FIG. 3, detailed description thereof will not be repeated.

In the present example, word driver unit WDUA provided in correspondence with word line WLA and word driver unit WDUB provided in correspondence with word line WLB are arranged on opposing sides of the memory array respectively, so that a sufficient layout pitch between word driver units WDUA or WDUB can also be ensured.

Here, as shown in the memory array in FIG. 15, it is assumed that data of "1", "2", "3", and "4" are successively stored in the memory cell group in the first row and data of "5", "6", "7", and "8" are successively stored in the memory cell group in the second row. Then, it is assumed that word line WLA0 is selected in the word driver unit group corresponding to port PA and word line WLB1 is selected in the word driver unit group corresponding to port PB.

In addition, it is assumed that control signals SEL0, SEL1 are set to "H" level and control signals SEL2, SEL3 are set to "L" level. Accordingly, selector circuit SLC0 switches electrical coupling of data line pair DLP0 to bit line pair BLBP0 to coupling to bit line pair BLAP0. Similarly, selector circuit SEC1 switches electrical coupling of data line pair DLP1 to bit line pair BLBP1 to coupling thereof to bit line pair BLAP1. Selector circuits SLC2, SLC3 maintain electrical coupling of data line pairs DLP2, DLP3 to bit line pairs BLBP2, BLBP3, respectively.

Then, as shown in FIG. 15(b), sense amplifier/write driver 15a corresponding to port PA outputs data of "1", "2", "3", and "4" read from the memory cells through bit line pairs BLAP0 to BLAP3, while sense amplifier/write driver 15b corresponding to port PB outputs data of "1", "2", "7", and "8" read from the memory cells through bit line pairs BLAP0, BLAP1, BLBP2, and BLBP3.

Therefore, by using selector circuit SLC, data can be read by using bit line pair BLA also in sense amplifier/write driver 15b.

Thus, data stored in any one of two memory cell rows can freely be read by performing data reading once, so that a degree of freedom in data reading is improved and efficient data reading can be achieved.

In the present example, the configuration in which selector circuit SLC is provided on sense amplifier/write driver 15b side and switching from bit line pair BLBP to bit line pair BLAP can be made has been described, however, for example, a configuration in which selector circuit SLC is provided on sense amplifier/write driver 15a side and switching from bit line pair BLAP to bit line pair BLBP can be made is also naturally possible.

(First Variation of Second Embodiment)

In the first variation of the present second embodiment, a configuration in which the semiconductor memory device described above is applied to a buffer memory for image processing will be described.

Figure 16:
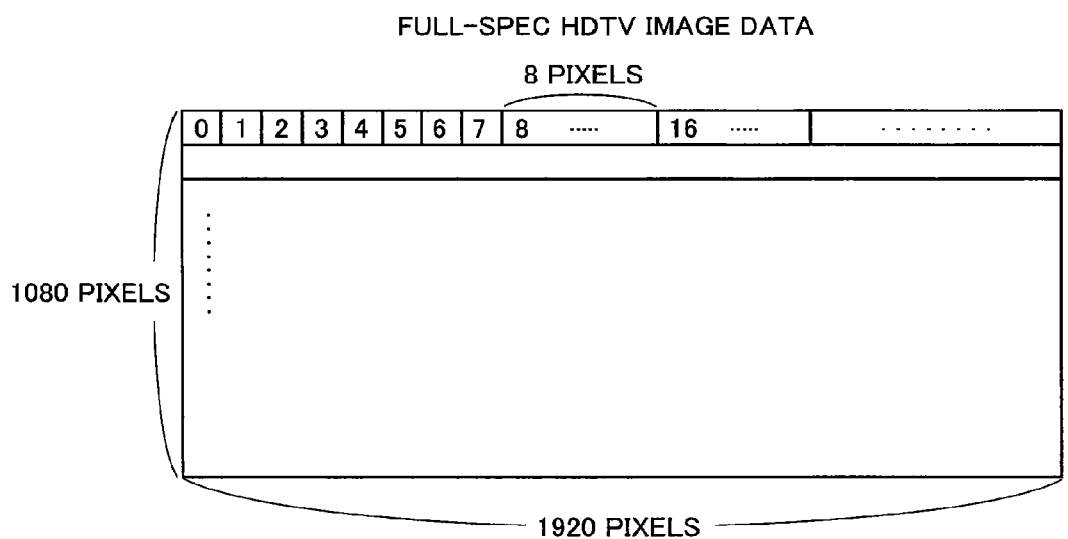
FIG. 16 shows the number of pixels in full-spec HDTV (High Definition TV) resolution.

FIG. 16 shows the number of pixels in full-spec HDTV (High Definition TV) resolution.

Referring to FIG. 16, a panel shown here displays a 1080× 1920 high-definition image having 1080 vertical pixels and 1920 horizontal pixels. In recent years, what is called H.264, MPEG4, JPEG, and the like have been proposed as schemes for coding/decoding (codec) such a high-precision image.

For real time processing of this moving image, though not shown, a codec circuit for performing codec processing is essential, and the buffer memory is used in that processing.

For instance, an example where data is grouped in a unit of 8 pixels on the panel and the data is mapped in the buffer memory will be described.

It is assumed here that pixels are numbered in ascending order for each pixel starting from "0"th, sequentially from upper left end in FIG. 16.

Figure 17:
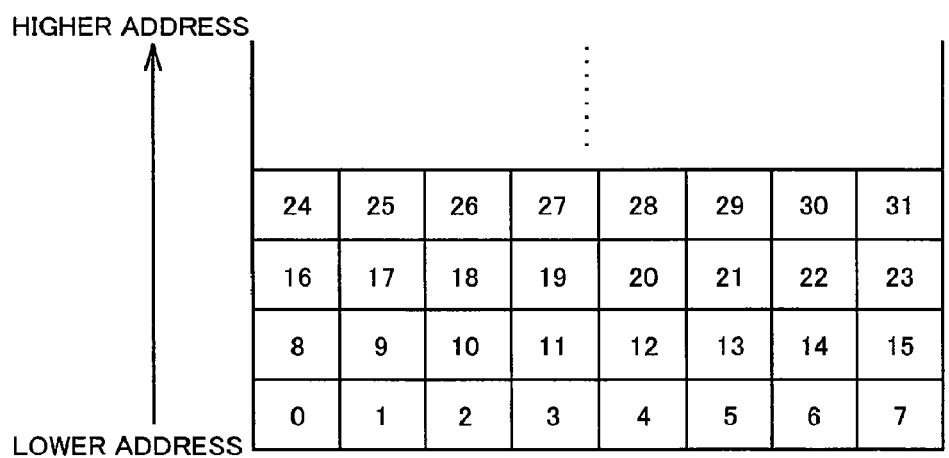
FIG. 17 is a conceptual diagram illustrating mapping in a buffer memory.

FIG. 17 is a conceptual diagram illustrating mapping in the buffer memory.

Referring to FIG. 17, an example where data in a unit of 8 pixels is mapped for each row is shown here. Specifically, data of "0"th to "7"th pixels are mapped at the lowest address, and data of "8"th to "15"th pixels is mapped in a row corresponding to a next higher address.

In addition, an example where data of "16"th to "23"rd pixels is sequentially mapped in the next row and data of "24"th to "31"st pixels is sequentially mapped in another next row is shown. Similarly, data is mapped for each pixel in a unit of 8 pixels, sequentially in a direction toward higher address.

For example, in the case of H.264 codec scheme, generally, data of one pixel is configured, for example, with an 8-bit luminance signal (Y signal) and a 4-bit color-difference signal (U signal, V signal), however, for the sake of simplicity, in the present example, description will be given assuming that data of one pixel is a 1-bit signal.

Figure 18:
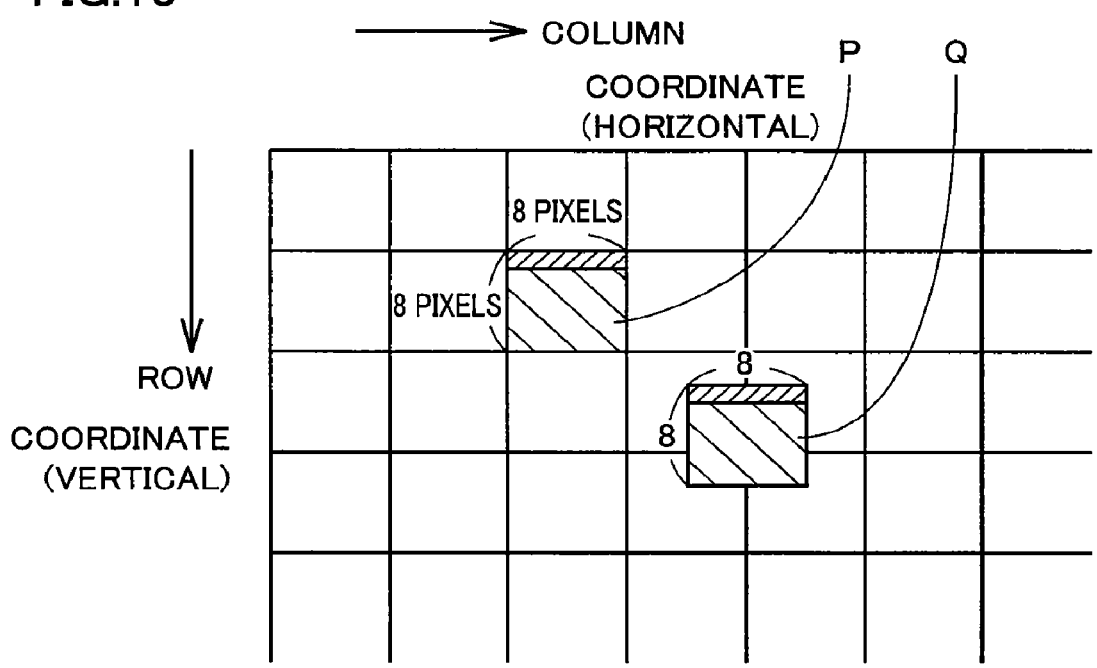
FIG. 18 is a diagram illustrating an example where a pixel data group is read from any starting coordinate in a panel in image processing such as motion detection of a moving image.

FIG. 18 is a diagram illustrating an example where a pixel data group is read from any starting coordinate in a panel in image processing such as motion detection of a moving image.

Here, an example where data of 8 pixels in the first row is read during access to a data group of 8×8 pixels will be described. It is noted here that a case where the panel is divided into 8×8-pixel block region groups is exemplarily shown.

Referring to FIG. 18, for example, if the first, starting pixel among 8 pixels in the first row in 8×8 data group in a P region designated in designation of 8×8-pixel data group is a multiples-of-8th pixel, access to 8-pixel data arranged in one row should be made as shown in FIG. 19(*a*), because the buffer memory stores data mapped in a unit of 8 pixels.

On the other hand, if the first, starting pixel among 8 pixels in the first row in 8×8 data group in a Q region designated in designation of 8×8-pixel data group is not a multiples-of-8th pixel, access to 8 pixels arranged in two rows across the row boundary, that is, 8-pixel data from a midpoint of a specific row to a midpoint of a next row, should be made as shown in FIG. 19(*b*), because the buffer memory stores data mapped in a unit of 8 pixels.

Figure 20:
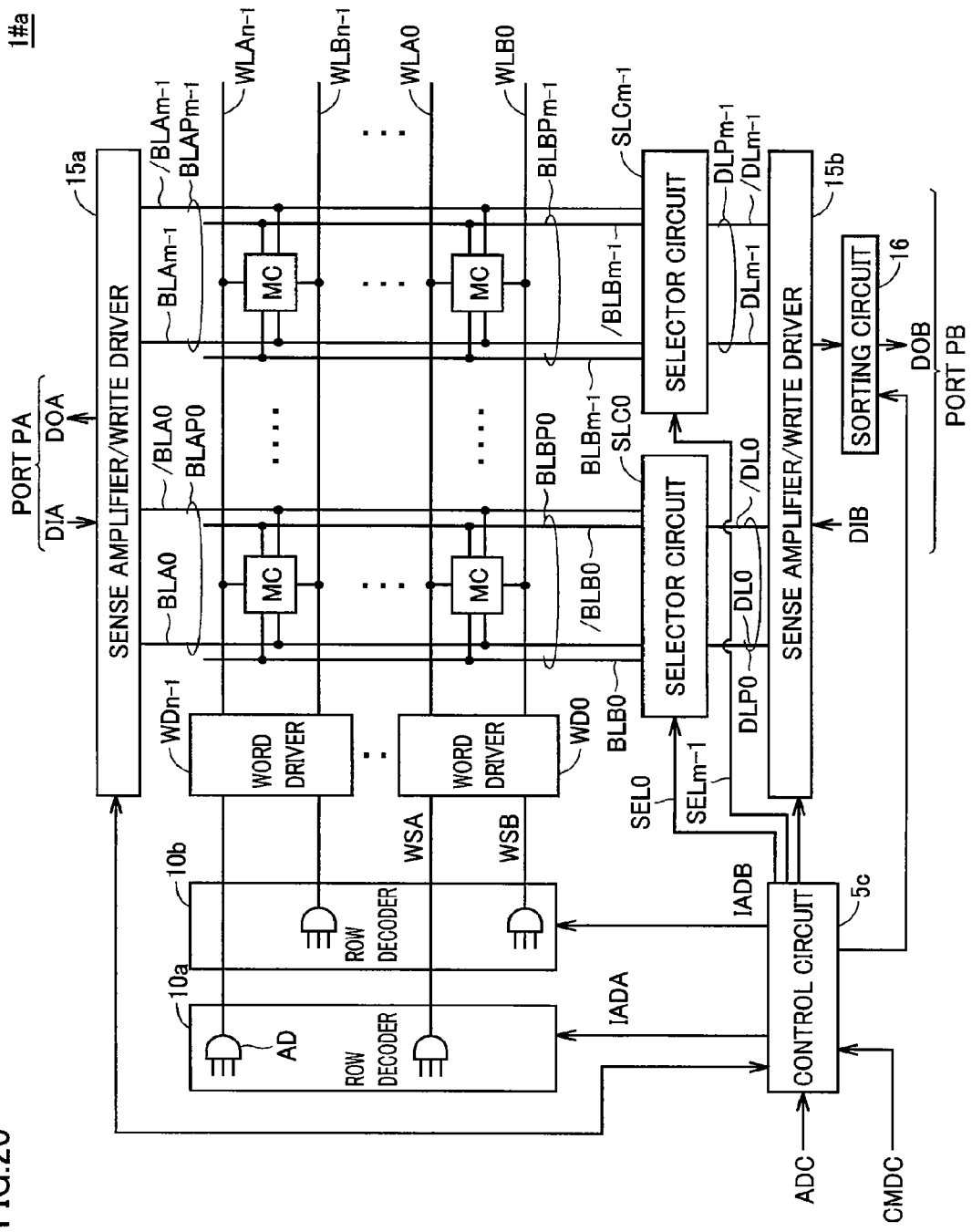
FIG. 20 is a schematic block diagram of a semiconductor memory device 1#a according to a first variation of the second embodiment of the present invention.

FIG. 20 is a schematic block diagram of a semiconductor memory device 1#*a* according to the first variation of the second embodiment of the present invention.

Referring to FIG. 20, semiconductor memory device 1#*a* according to the first variation of the second embodiment of the present invention is different from semiconductor memory device 1# described in connection with FIG. 13 in that control circuits 5*a* and 5*b* for port PA and port PB respectively are replaced with a single control circuit 5*c* controlling entire ports PA and PB and that semiconductor memory device 1#*a* further includes a sorting circuit 16. As the semiconductor memory device is otherwise the same as semiconductor memory device 1#, detailed, description thereof will not be repeated.

Specifically, control circuit 5*c* outputs buffered internal row address signals IADA, IADB to row decoders 10*a*, 10*b* based on an input of an input address signal ADC. In addition, control circuit 5*c* issues a necessary instruction or executes necessary control for other peripheral circuits so as to perform a prescribed operation based on an input command signal CMDC. For example, during data reading, control circuit 5*c* controls sense amplifier/write drivers 15*a*, 15*b* to give an instruction to output storage data read through a bit line to the outside as read data DOA, DOB, and during data writing, control circuit 5*c* gives an instruction to write externally input write data DIA, DIB into the memory cell in accordance with a selected address through the bit line.

Sorting circuit 16 is provided in correspondence with sense amplifier/write driver 15*b*. During data reading, sorting circuit 16 changes the sequence of output data output from sense amplifier/write driver 15*b* in accordance with the instruction from control circuit 5*c* and outputs the data as read data DOB.

In the present example, though word driver WD has been described assuming that it is configured similarly to the first embodiment, the word driver is not limited as such. The configuration including only word driver units WDUA and WDUB without including power supply line unit VDR described in connection with FIG. 3 is also applicable. In such a case, it is assumed that power supply line VDW supplying the power supply voltage to memory cell MC is connected to power supply voltage VDD in a fixed manner.

Figure 21:
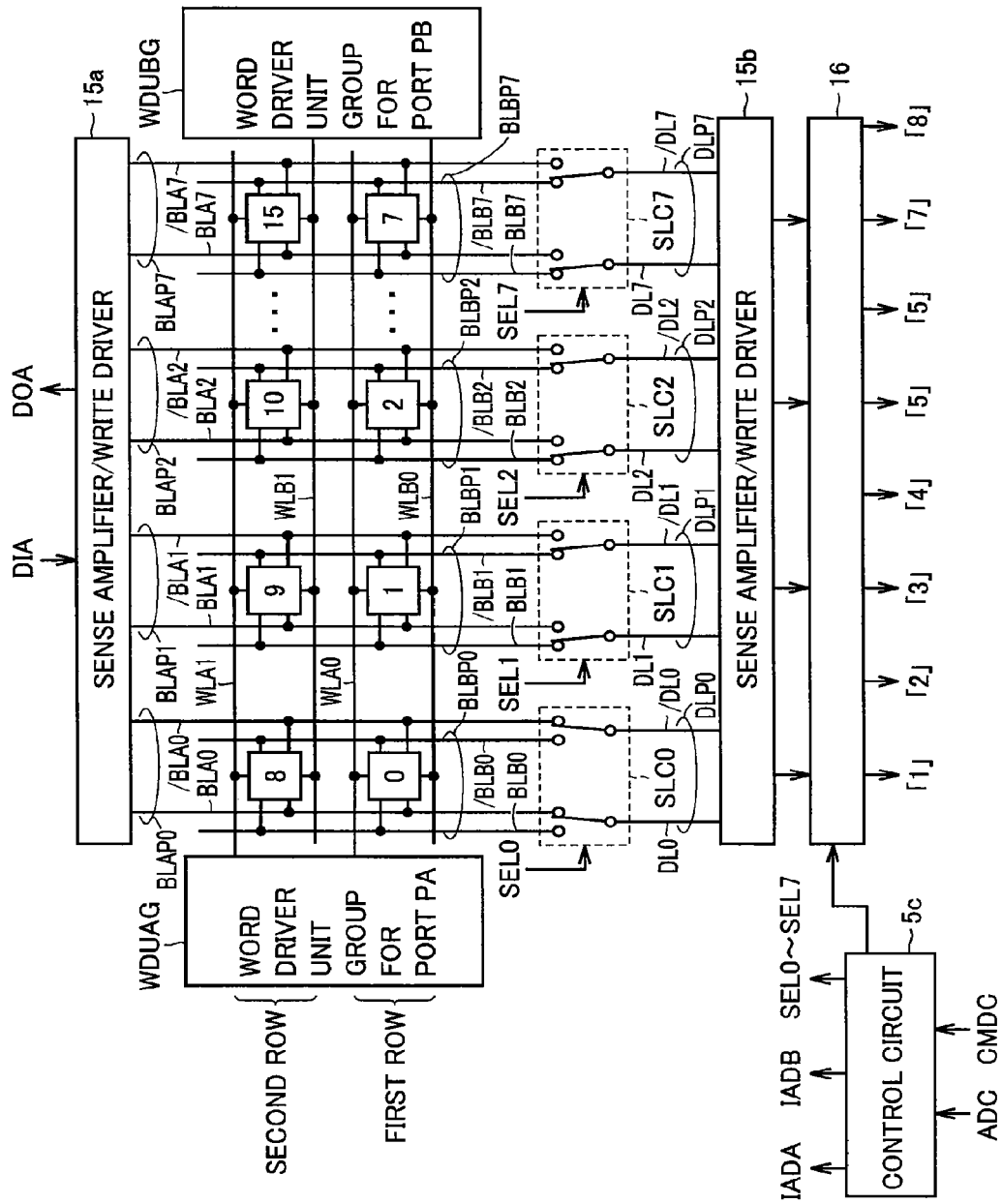
FIG. 21 is a diagram illustrating an example where semiconductor memory device 1#a according to the first variation of the second embodiment of the present invention operates.

FIG. 21 is a diagram illustrating an example where semiconductor memory device 1#*a* according to the first variation of the second embodiment of the present invention operates.

Referring to FIG. 21, in the present example, a memory array in which data is mapped in a unit of 8 pixels as described above is shown by way of example. Specifically, an example where a memory array configured with two memory cell rows and eight memory cell columns is used as a buffer memory is shown here. As shown in the memory array in FIG. 21, it is assumed that data of "0"th to "7"th pixels is sequentially stored in the memory cell group in the first row and data of "8"th to "15"th pixels is sequentially stored in the memory cell group in the second row.

Here, an example where input address signal ADC designates data of "1"st pixel and data of 8 pixels from "1"st to "8"th pixels is read will be described.

It is noted here that an example where data is mapped in a unit of 8 pixels as described above is shown and it is assumed that data reading is performed in a unit of 8 pixels.

In addition, as the memory array is configured with 8 memory cell columns as described above, it is assumed that a column address signal (CA) included in input address signal ADC is configured with three bits, and column address signals (CA2 to CA0) for the first column corresponding to data of "0"th, "8"th and 16th, that are multiples of 8, are associated with "000". In addition, it is assumed that the column address signals (CA2 to CA0) for the second column are associated with "001". Similarly, it is assumed that 3-bit column address signal CA is incremented and column address signals for up to the eighth column are associated.

Control circuit 5*c* outputs internal row address signals IADA, IADB in accordance with the input of input address signal ADC. For example, control circuit 5*c* determines whether the column address signals (CA2 to CA0) included in input address signal ADC indicate "000" or not. If the column address signals (CA2 to CA0) indicate "000", the first, starting pixel among 8 pixels in the first row is the multiples-of-8th pixel. Therefore, data of 8 pixels arranged in one row is accessed. Then, control circuit 5*c* outputs internal row address signal IADA for activating the corresponding memory cell row in accordance with the row address signal included in input address signal ADC.

On the other hand, if the column address signals (CA2 to CA0) do not indicate "000", the first, starting pixel among 8 pixels in the first row is not the multiples-of-8th pixel. Therefore, access to data of 8 pixels arranged in two rows across the row boundary is made. Then, control circuit 5c outputs internal row address signal IADA for activating the corresponding memory cell row in accordance with the row address signal included in input address signal ADC and outputs internal row address signal IADB for accessing the adjacent memory cell row.

In the present example, when it is assumed that input address signal ADC designates data of the "1"st pixel, the column address signals (CA2 to CA0) included in input address signal ADC do not indicate "000", and therefore, access to data of 8 pixels arranged in two rows across the row boundary should be made. Then, in accordance with the row address signal included in input address signal ADC, internal row address signal IADA for activating the memory cell row, which is the lower address row out of two memory cell rows adjacent to each other, and internal row address signal IADB for accessing the memory cell row which is the adjacent, higher address row are output. Specifically, word driver unit WDUAG for port PA activates word line WLA0 in accordance with internal row address signal IADA. In addition, word driver unit WDUAG for port PB activates word line WLB1 in accordance with internal row address signal IADB.

In response to activation of word line WLA0, the memory cells corresponding to data of "0"th to "7"th pixels are electrically connected to bit line pair BLAP. In response to activation of word line WLB1, the memory cells corresponding to data of "8"th to "15"th pixels are electrically connected to bit line pair BLBP.

In addition, control circuit 5c outputs control signal SEL in accordance with the column address signal included in input address signal ADC. Specifically, for data of 8 pixels, control signal SEL is set to "H" level for selector circuit SLC corresponding to the column from which reading is to be performed in accordance with word line WLA. On the other hand, control signal SEL is set to "L" level for selector circuit SLC corresponding to the column from which reading is to be performed in accordance with word line WLB.

In the present example, it is assumed that input address signal ADC designates data of the "1"st pixel as described above to read data of 8 pixels from "1"st to "8"th pixels and the column address signals (CA2 to CA0) included in input address signal ADC indicate "001" designating the second column.

Accordingly, control circuit 5c sets to "H" level, control signals SEL1 to SEL7 corresponding to selector circuits SLC for the second column to the eighth column corresponding to the columns from which reading is to be performed in accordance with word line WLA in response to the input column address signal. Then, control circuit 5c sets to "L" level, control signal SEL0 corresponding to selector circuit SLC for the first column corresponding to the column from which reading is to be performed in accordance with word line WLB in response to the input column address signal.

Accordingly, selector circuit SLC0 maintains electrical coupling of data line pair DLP0 to bit line pair BLBP0. On the other hand, selector circuits SLC1 to SLC7 switch electrical coupling of data line pairs DLP1 to DLP7 to bit line pairs BLBP1 to BLBP7 to coupling thereof to bit line pairs BLAP1 to BLAP7, respectively.

Then, sense amplifier/write driver 15b outputs data of "8"th, "1"st, "2"nd, "3"rd, "4"th, "5"th, "6"th, and "7"th pixels through bit line pairs BLBP0, BLAP1 to BLAP7.

Namely, when input address signal ADC designates data of the "1"st pixel, data of 8 pixels from "1"st to "8"th pixels can be read.

Here, though pixel data stored in the buffer memory is sequentially stored in a unit of 8 pixels, pixel data read from sense amplifier/write driver 15b is not in sequence when viewed from the left.

Therefore, in order to match the interface between the buffer memory and an image processing engine, sorting circuit 16 for always obtaining pixel data continuous from the leftmost side is provided.

Specifically, sorting circuit 16 performs sorting in accordance with the column address signal included in input address signal ADC. In the present example, sorting for output is performed so that data of "1"st, "2"nd, "3"rd, "4"th, "5"th, "6"th, "7"th, and "8"th pixels from the left is obtained.

In other words, as in this configuration, even though the first, starting pixel of 8-pixel data designated in accordance with input address signal ADC is not the multiples-of-8th pixel, that is, even though access to data of 8 pixels arranged in two rows across the row boundary should be made, data of 8 pixels can be read by making access once.

On the other hand, if the first, starting pixel of 8-pixel data designated in accordance with input address signal ADC is the multiples-of-8th pixel, the column address signals (CA2 to CA0) indicate "000" and data of 8 pixels arranged in one row is accessed. Namely, word line WLA for the corresponding memory cell row is activated in accordance with the row address signal included in input address signal ADC as described above.

Here, control circuit 5c sets to "H" level, control signals SEL0 to SEL7 corresponding to selector circuits SLC in the first to eighth columns corresponding to the columns from which reading is to be performed in accordance with word line WLA in response to the input column address signal.

Accordingly, selector circuits SLC0 to SLC7 switch electrical coupling of data line pairs DLP0 to DLP7 to bit line pairs BLBP0 to BLBP7 to coupling thereof to bit line lines BLAP0 to BLAP7, respectively.

Then, sense amplifier/write driver 15b outputs data of 8 pixels arranged in one row through bit line pairs BLAP0 to BLAP7.

Here, pixel data read from sense amplifier/write driver 15b is the continuous pixel data stored sequentially in the buffer memory. Therefore, sorting circuit 16 supplies output in that sequence as it is, in accordance with the column address signal included in input address signal ADC.

Therefore, according to the configuration of the subject application, in reading the pixel data group from any starting coordinate in the panel in image processing such as motion detection of a moving image as described in connection with FIG. 18, data of any 8 pixels can be read by making access once from the buffer memory in which the pixel data is mapped in a unit of 8 pixels, and image processing at higher speed can be achieved.

In the present example, the configuration for reading data of any 8 pixels by making access once from the buffer memory in which the pixel data is mapped in a unit of 8 pixels has been described, however, the example is not limited to 8 pixels and modification can freely be made.

In addition, in the present example, the column address signals (CA2 to CA0) corresponding to the first column of the 8-column buffer memory in which the pixel data is mapped in a unit of 8 pixels are associated with "000". Accordingly, whether access to data of 8 pixels corresponding to one row or access to data of 8 pixels arranged in two rows across the row boundary should be made is determined based on whether the column address signals (CA2 to CA0) indicate "000" or not. If the column address signals (CA2 to CA0) corresponding to the first column are associated with an address value other than "000", however, the address value for determination may naturally be changed accordingly.

In the present example, the configuration, in which selector circuit SLC is provided in correspondence with sense amplifier/write driver 15b, and connection between bit line pair BLBP and sense amplifier/write driver 15b through selector SLC is switched to connection between bit line pair BLAP and sense amplifier/write driver 15b when pixel data is to be read through bit line pair BLAP, has been described.

On the other hand, in a configuration where selector circuit SLC is provided in correspondence with sense amplifier/write driver 15a, a similar configuration can be implemented by switching connection between bit line pair BLAP and sense amplifier/write driver 15a through selector SLC to connection between bit line pair BLBP and sense amplifier/write driver 15a when pixel data is to be read through bit line pair BLBP.

(Second Variation of Second Embodiment)

In the first variation of the second embodiment above, a scheme for accessing two adjacent memory cell rows by using row decoders 10a, 10b for ports PA, PB has been described. In the second variation of the present second embodiment, a scheme for accessing two adjacent memory cell rows with a simplified configuration will be described.

Figure 22:
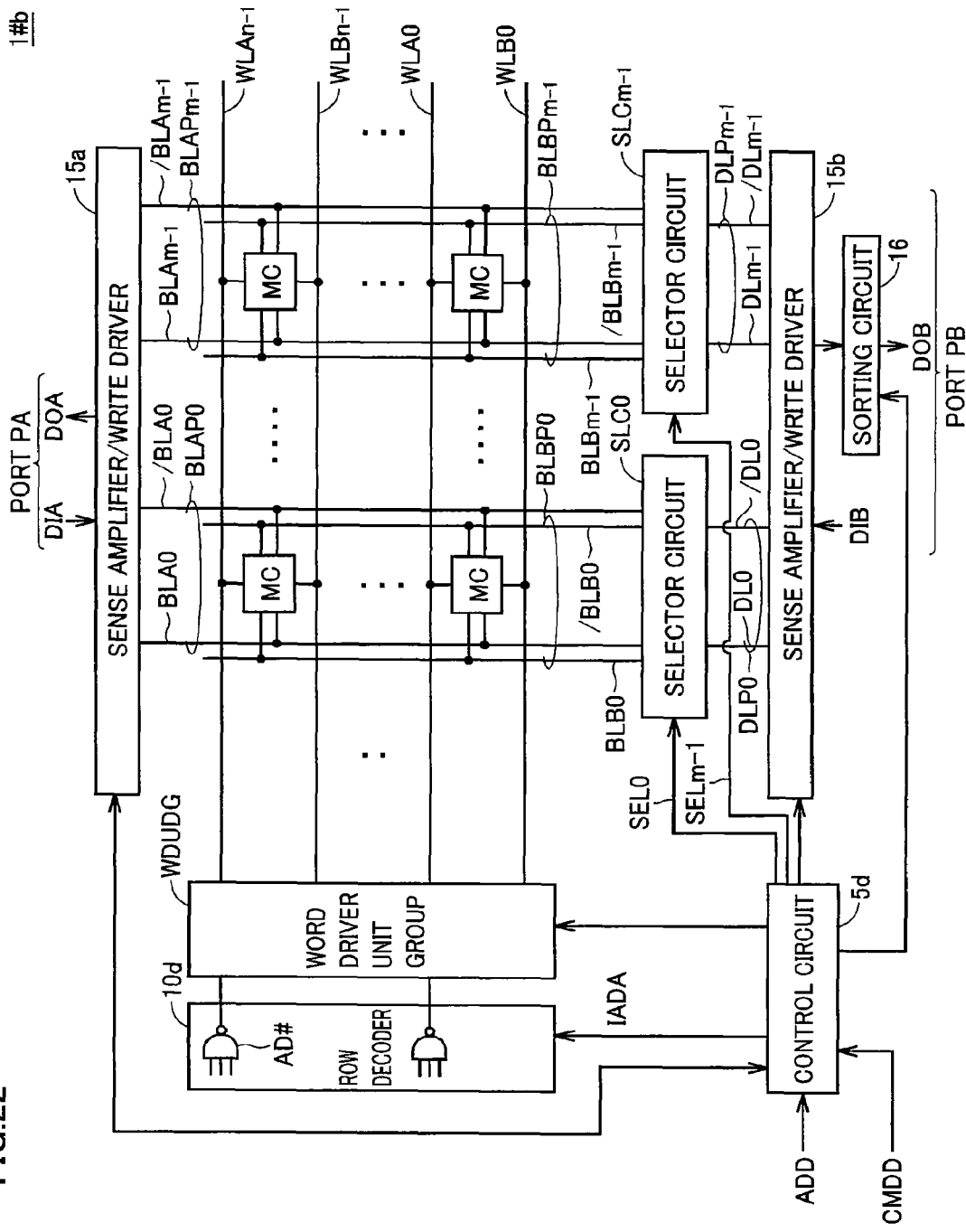
FIG. 22 is a schematic block diagram of a semiconductor memory device 1#b according to a second variation of the second embodiment of the present invention.

FIG. 22 is a schematic block diagram of a semiconductor memory device 1#b according to the second variation of the second embodiment of the present invention.

Referring to FIG. 22, semiconductor memory device 1#b according to the second variation of the second embodiment of the present invention is different from semiconductor memory device 1#a described in connection with FIG. 21 in that control circuit 5c is replaced with a control circuit 5d and row decoders 10a, 10b for port PA and port PB are replaced with a single row decoder 10d, and in that a word driver unit group WDUDG driving word lines WLA, WLB in response to a row selection instruction from row decoder 10d is provided. As the semiconductor memory device is otherwise the same as semiconductor memory device 1#b, detailed description thereof will not be repeated.

Specifically, control circuit 5d outputs buffered internal row address signal IADA to row decoder 10d based on an input of an input address signal ADD. In addition, control circuit 5d issues a necessary instruction or executes necessary control for other peripheral circuits so as to perform a prescribed operation based on an input command signal CMDD. For example, during data reading, control circuit 5d controls sense amplifier/write drivers 15a, 15b to give an instruction to output storage data read through a bit line to the outside as read data DOA, DOB, and during data writing, control circuit 5d gives an instruction to write externally input write data DIA, DIB into the memory cell in accordance with a selected address through the bit line.

In addition, control circuit 5d includes an address determination portion which will be described later, and if an address signal included in input address signal ADD satisfies a prescribed condition, control circuit 5d outputs a control signal to word driver unit group WDUDG.

Figure 23:
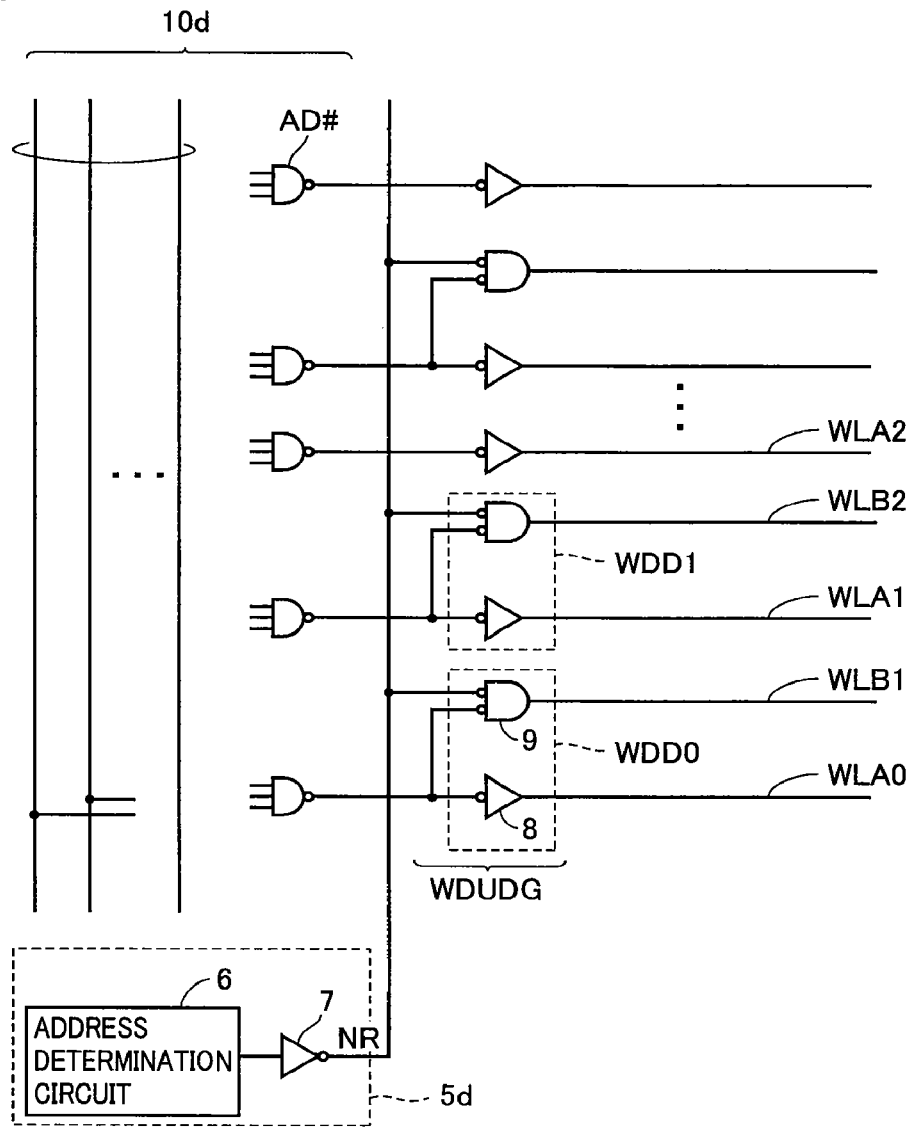
FIG. 23 is a diagram illustrating a circuit group performing a row-related selection operation according to the second variation of the second embodiment of the present invention.

FIG. 23 is a diagram illustrating a circuit group performing a row-related selection operation according to the second variation of the second embodiment of the present invention.

Referring to FIG. 23, here, row decoder 10d, a word driver WDD implementing word driver unit group WDUDG and the address determination portion included in control circuit 5d are shown as a circuit group performing a row-related selection operation.

Specifically, row decoder 10d outputs a decode signal representing a row selection result to word driver WDD based on the input of buffered internal row address signal IADA from control circuit 5d. It is assumed in the present example that row decoder 10d is configured with a plurality of logic circuits AD# and row decoder 10d outputs the decode signal (row selection signal) at "L" level to corresponding word driver WDD, based on one of combinations of input internal row address signals.

Word driver unit group WDUDG includes a plurality of word driver units WDD each provided in correspondence with word lines WLA, WLB corresponding to two adjacent memory cell rows respectively, for driving corresponding word lines WLA, WLB based on the decode signal representing the row selection result. Word driver WDD implementing word driver unit group WDUDG drives the corresponding word line upon receiving the input of the decode signal at "L" level output from corresponding logic circuit AD# in row decoder 10d. Here, an example where a word driver WDD0 is provided in correspondence with word line WLA0 provided in correspondence with the first memory cell row and word line WLB1 provided in correspondence with the second memory cell row, and a word driver WDD1 is provided in correspondence with word line WLA1 provided in correspondence with the second memory cell row and word line WLB2 provided in correspondence with the third memory cell row is shown. It is assumed that other word drivers WDD are also provided in a similar manner.

In the present configuration, as it is not particularly necessary to select word line WLB0, the configuration is such that connection thereof to word driver WDD is not made, however, the configuration may be changed such that word line WLB0 is employed.

In addition, the address determination portion included in control circuit 5d includes an address determination circuit 6 and a buffer 7. Address determination circuit 6 includes an address determination portion which will be described later input address, and if the address signal included in input address signal ADD satisfies a prescribed condition, address determination circuit 6 outputs a control signal to word driver unit group WDUDG.

A configuration of word driver WDD will now be described.

Word driver WDD is provided in correspondence with word lines WLA, WLB corresponding to two adjacent memory cell rows respectively. Specifically, word driver WDD includes logic circuits 8 and 9 provided in correspondence with word lines WLA, WLB respectively.

Receiving the decode signal ("L" level) representing the result of row selection by row decoder 10d, logic circuit 8 drives word line WLA. Receiving the decode signal representing the result of row selection by row decoder 10d and a control signal NR, logic circuit 9 drives word line WLB. Specifically, receiving the decode signal ("L" level), logic circuit 8 activates word line WLA. On the other hand, receiving the decode signal ("L" level) and control signal NR ("L" level), logic circuit 9 activates word line WLB.

Therefore, when control signal NR ("L" level) is input to word driver WDD, word driver WDD drives, that is, activates, both word lines WLA, WLB.

Here, an example where a memory array according to the second variation of the present second embodiment is employed as the buffer memory in which pixel data is mapped in a unit of 8 pixels, in reading the pixel data group from any starting coordinate in the panel in image processing such as motion detection of a moving image as described in the first variation of the second embodiment, will be described.

Here, even though access to data of 8 pixels, that is, 8 pixels arranged in two rows across the row boundary, designated in accordance with the input address signal is made as described above, it is not necessary to drive word lines WLA, WLB using row decoders independent of each other, but word line WLA and word line WLB corresponding to adjacent memory cell rows can be driven in accordance with the instruction of the decode signal ("L" level) from a single row decoder.

Here, the address determination portion determines whether access to 8 pixels arranged in two rows across the row boundary or access to 8 pixels arranged in one row should be made.

Figure 24:
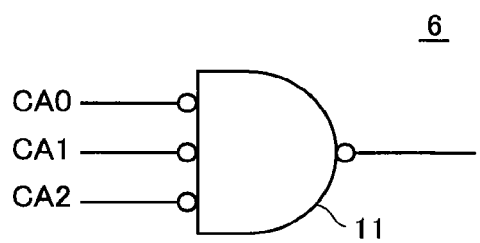
FIG. 24 is a diagram illustrating a logic circuit configuring an address determination circuit 6 included in an address determination portion.

FIG. 24 is a diagram illustrating a logic circuit configuring address determination circuit 6 included in the address determination portion.

Referring to FIG. 24, for example, address determination circuit 6 includes a logic circuit 11, and outputs a control signal based on combination of column address signals CA0 to CA2 included in input address signal ADD. It is assumed in the present example that the column address signal is associated as described in connection with FIG. 22.

For example, it is assumed that "L" level is output when the column address signals (CA0 to CA2) indicate "000". Then, buffer circuit 7 outputs as control signal NR, an inverted signal of the output signal from logic circuit 11 to word driver unit group WDUDG. Here, when the column address signals (CA0 to CA2) indicate "000", control signal NR is set to "H" level, and control signal NR is otherwise set to "L" level.

When control signal NR is at "H" level, logic circuit 9 in word driver WDD maintains word line WLB in an inactivated state, even though it receives the decode signal ("L" level) representing the result of row selection by row decoder 10d.

Therefore, here, logic circuit 8 in word driver WDD drives solely word line WLA in accordance with the decode signal ("L" level) representing the row selection result.

Namely, according to this configuration, the function the same as in the first variation of the second embodiment can be attained.

Therefore, according to the configuration of the second variation of the present second embodiment, as compared with the configuration according to the first variation, the number of parts can be decreased by eliminating a row decoder and simplifying the configuration of the row-related selection circuit, and an area for the row-related selection circuit and hence power consumption can be made smaller. In addition, as the configuration is not such that word lines WLA, WLB for the same row are simultaneously selected, a dimension ratio of a transistor for ensuring safety is comparable to a size of a single-port transistor. Accordingly, an area for a memory cell and a leakage current can be made smaller.

(Third Embodiment)

In the present third embodiment, a configuration capable of achieving a smaller circuit area by sharing a sense amplifier/write driver when a plurality of memory arrays are provided will be described.

Figure 25:
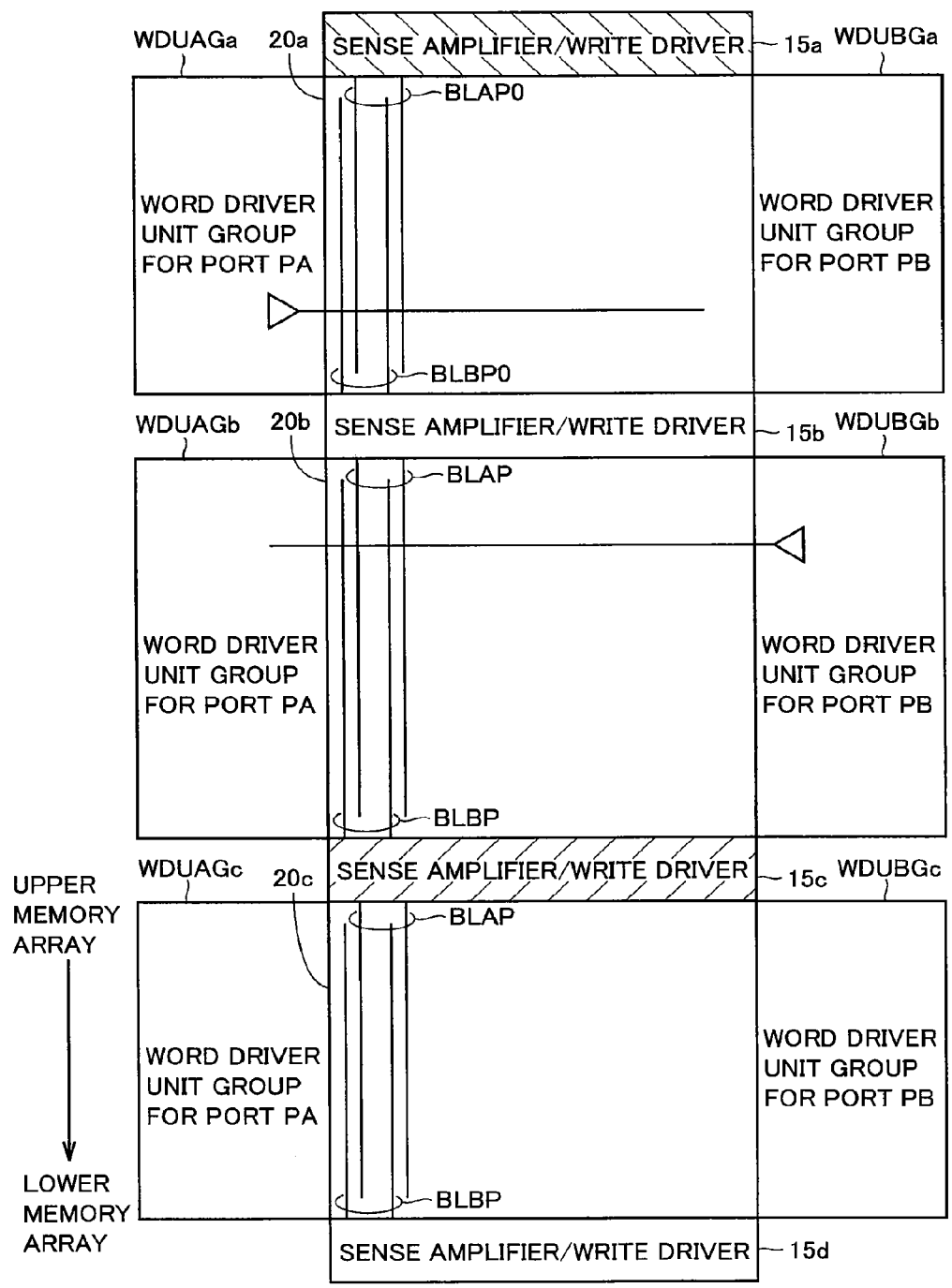
FIG. 25 is a diagram illustrating a schematic configuration of a semiconductor memory device according to a third embodiment of the present invention.

FIG. 25 is a diagram illustrating a schematic configuration of a semiconductor memory device according to the third embodiment of the present invention.

Referring to FIG. 25, the configuration here is such that a plurality of memory arrays are provided along the column direction. Specifically, memory arrays are provided along the column direction from an upper memory array to a lower memory array, in the order of memory arrays 20a, 20b, and 20c.

In addition, word driver unit groups WDUAG, WDUBG constituted of word driver units WDUA or WDUB driving word line WLA or WLB are provided on opposing sides of the memory array. As word driver unit WDUA or WDUB is as described in connection with FIG. 3, detailed description thereof will not be repeated.

In the present example, word driver unit WDUA provided in correspondence with word line WLA and word driver unit WDUB provided in correspondence with word line WLB are arranged on opposing sides of the memory array respectively, so that a sufficient layout pitch between word driver units WDUA or WDUB can be ensured. It is noted that a word driver unit group WDUAGa for port PA and a word driver unit group WDUBGa for port PB are provided on opposing sides of memory array 20a. Similarly, a word driver unit group WDUAGb for port PA and a word driver unit WDUBGb for port PB are provided on opposing sides of memory array 20b. In addition, a word driver unit group WDUAGc for port PA and a word driver unit group WDUBGc for port PB are provided on opposing sides of memory array 20c.

Sense amplifier/write driver 15a is electrically coupled to bit line pair BLAP in memory array 20a. In addition, sense amplifier/write driver 15b is electrically coupled to bit line pair BLBP in memory array 20a. As the configuration is the same as described in connection with FIG. 1, detailed description thereof will not be repeated.

In the third embodiment of the present invention, sense amplifier/write driver 15b is electrically coupled to bit line pair BLAP in memory array 20b. Namely, sense amplifier/write driver 15b is configured to be shared by memory arrays 20a and 20b. A sense amplifier 15c is electrically coupled to bit line pair BLBP in memory array 20b. In addition, sense amplifier 15c is electrically coupled to bit line pair BLAP in memory array 20c as described above. Namely, sense amplifier 15c is configured to be shared by memory arrays 20b and 20c. A sense amplifier 15d is electrically coupled to bit line pair BLBP in memory array 20c.

In the present third embodiment, one sense amplifier/write driver is provided on each of the opposing sides of the memory array, and the sense amplifier/write driver provided between two adjacent memory arrays is electrically coupled to bit line pair BLAP of one memory array and electrically coupled to bit line pair BLBP of the other memory array.

According to this configuration, for example, when the same memory array is selected and data reading and writing from/to memory array 20a through two ports is performed, sense amplifier/write drivers 15a and 15b are used as the sense amplifier/write drivers for ports PA and PB. This feature is the same as above.

On the other hand, when two different memory arrays 20a and 20b are selected and data reading and writing through two ports is performed, sense amplifier/write driver 15a is used for memory array 20a. On the other hand, sense amplifier/write driver 15c is used for memory array 20b. It is assumed in the present example that the control circuit carries out control such that, when two different memory arrays are selected, word driver unit group WDUAG for port PA is used for an operation for selecting a word line in the upper memory array, while word driver unit group WDUBG for port PB is used for an operation for selecting a word line in the lower memory array.

Namely, in the present example, when data reading and writing is performed through port PA out of selected two memory arrays on one and the other sides in performing data reading and writing through two ports, the sense amplifier/write driver provided in correspondence with one side of the memory array on one side out of the two memory arrays is used to perform data reading and writing. In addition, in performing data reading and writing through port PB, the sense amplifier/write driver provided in correspondence with the other side of the memory array on the other side out of the two memory arrays is used to perform data reading and writing. Referring to the example, when memory arrays 20a and 20b are selected as memory arrays on one and the other sides, sense amplifier/write driver 15a provided on one side of memory array 20a is selected for reading and writing through port PA, to perform data reading and writing through port PA. In addition, sense amplifier/write driver 15c provided on the other side is selected for memory array 20b, to perform data reading and writing through port PB.

According to this configuration, the sense amplifier/write driver provided between two adjacent memory arrays can be shared by two memory arrays. Therefore, even when a plurality of memory arrays are provided, it is not necessary to provide two independent sense amplifier/write drivers for ports PA and PB in each memory array, and the circuit area can be made smaller by sharing.

(Variation of Third Embodiment)

Figure 26:
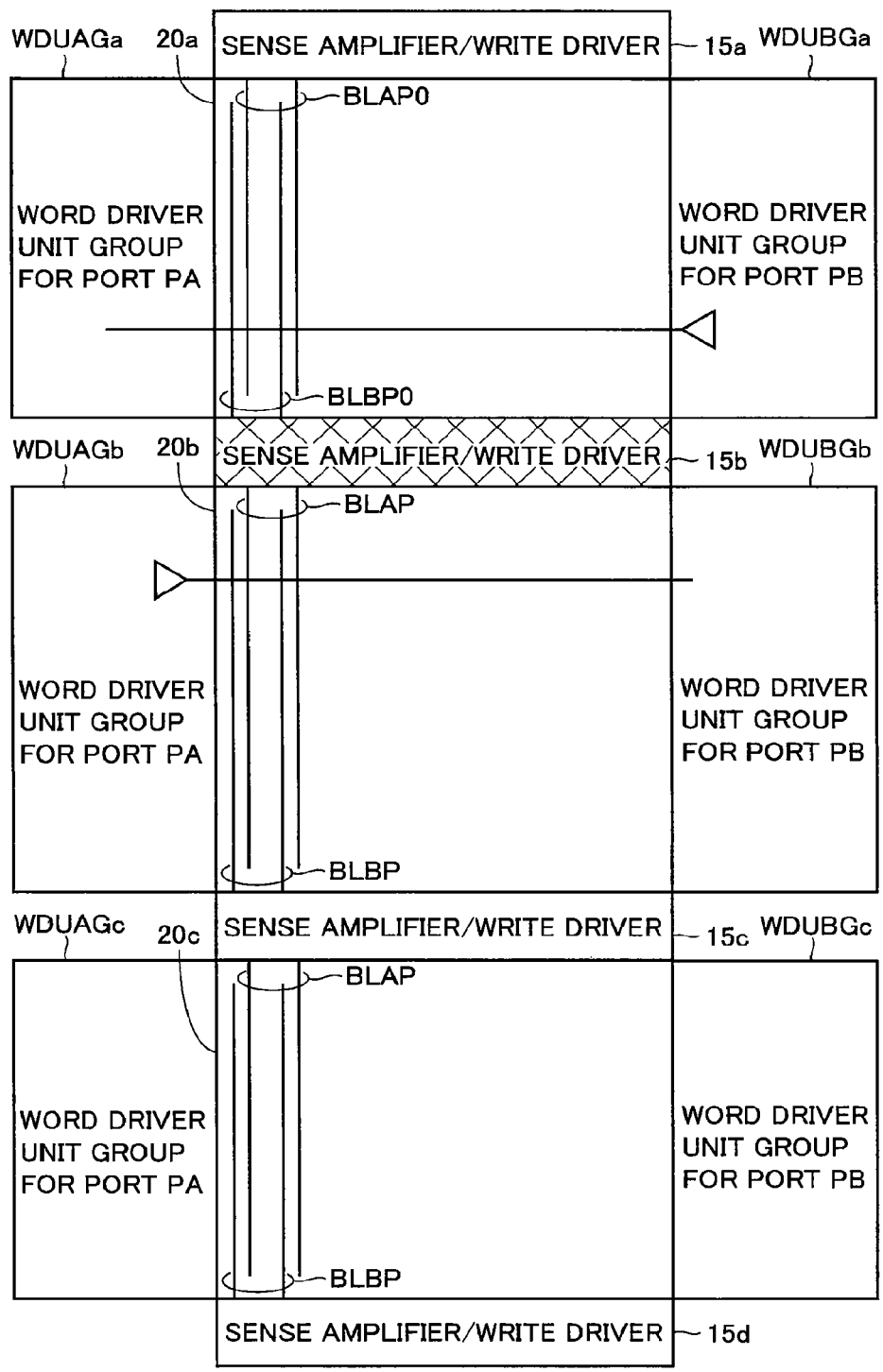
FIG. 26 is a diagram illustrating another example of data reading and writing through two ports when two different memory arrays 20a and 20b are selected.

FIG. 26 is a diagram illustrating another example of data reading and writing through two ports when two different memory arrays 20a and 20b are selected.

In the configuration in FIG. 25, the example where word driver unit group WDUAG for port PA is used for the operation for selecting a word line in the upper memory array and word driver unit group WDUBG for port PB is used for the operation for selecting a word line in the lower memory array has been described. Here, an example where word driver unit group WDUAG for port PB is used for an operation for selecting a word line in upper memory array 20a and word driver unit group WDUAG for port PA is used for an operation for selecting a word line in lower memory array 20b is considered.

Then, as shown in FIG. 26, port PA and port PB both operate to use sense amplifier/write driver 15b in conflict, and the operation for selection may not simultaneously be performed.

Figure 27:
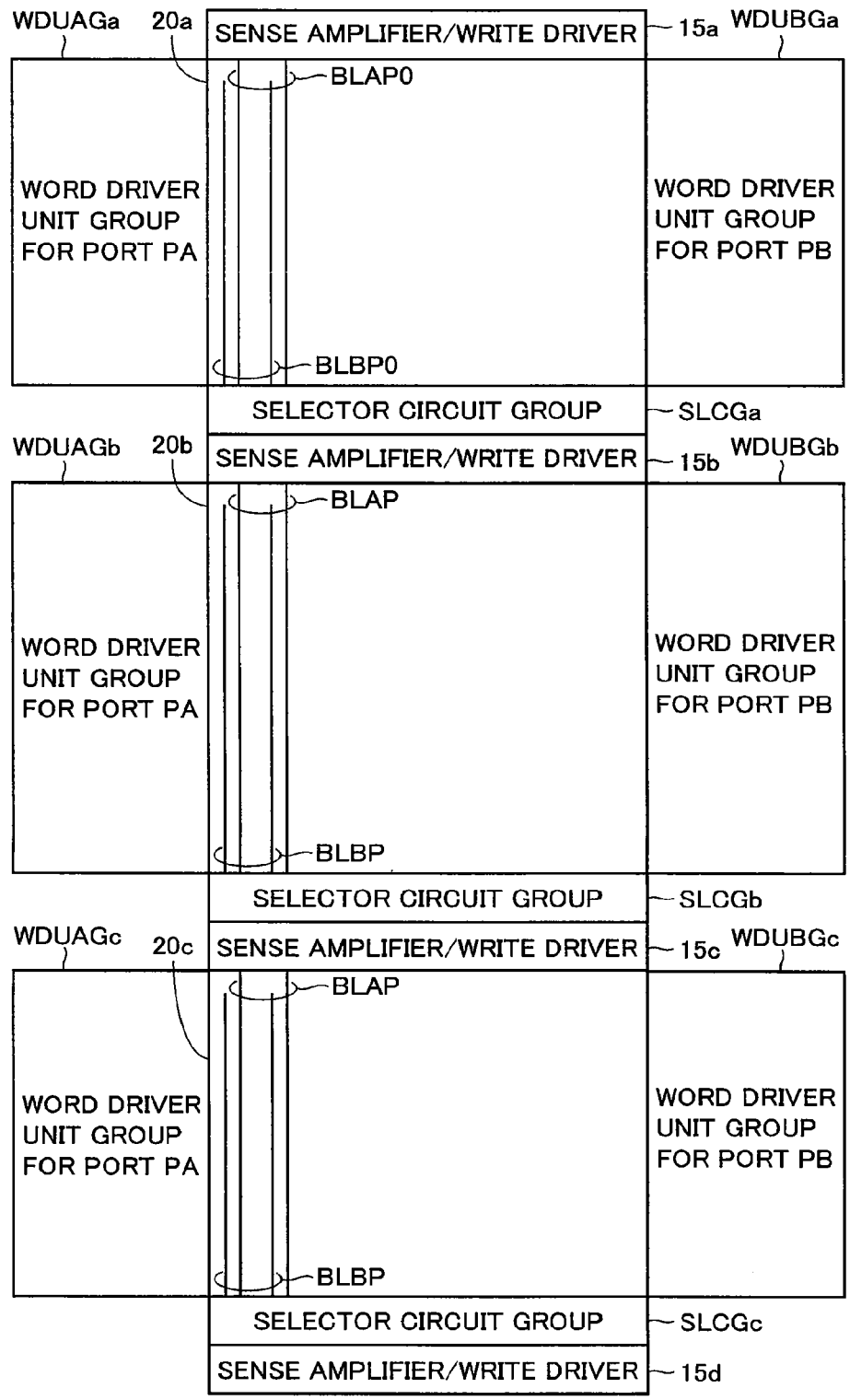
FIG. 27 is a diagram illustrating a schematic configuration of a semiconductor memory device according to a variation of the third embodiment of the present invention.

FIG. 27 is a diagram illustrating a schematic configuration of a semiconductor memory device according to a variation of the third embodiment of the present invention.

Referring to FIG. 27, the variation is different from the semiconductor memory device according to the third embodiment described in connection with FIG. 25 in further including a selector circuit group. Specifically, the present example is different in that a selector circuit group SLCGa constituted of selector circuits is provided between memory array 20a and sense amplifier/write driver 15b, a selector circuit group SLCGb constituted of selector circuits is provided between memory array 20b and sense amplifier/write driver 15c, and a selector circuit group SLCGc constituted of selector circuits is provided between memory array 20c and sense amplifier/write driver 15d. It is noted that the selector circuit group is collectively referred to as selector circuit group SLCG. As the configuration is otherwise the same, detailed description thereof will not be repeated.

It is assumed that selector circuit group SLCG includes a plurality of selector circuits SLC described in connection with the configuration of semiconductor memory device 1# in FIG. 13, and each selector circuit SLC is connected to the sense amplifier/write driver as described in connection with FIG. 13. As the configuration of selector circuit SLC is the same as described in connection with FIG. 14, detailed description thereof will not be repeated.

Therefore, according to the configuration where selector circuit SLC is provided between the sense amplifier/write driver and the memory array as described above, for example, sense amplifier/write driver 15b is configured to be capable of switching from bit line pair BLBP to bit line pair BLAP in response to control signal SEL.

Similarly, this is also the case with sense amplifier/write drivers 15c and 15d.

Therefore, for example, as described in connection with the configuration in FIG. 26, when word driver unit group WDUBG for port PB is used for the operation for selecting the word line in upper memory array 20a and word driver unit group WDUAG for port PA is used for the operation for selecting the word line in lower memory array 20b, selector circuit group SLCG is used to perform a switching operation from bit line pair BLBP to bit line pair BLAP. Thus, the operation of port PA and port PB to use the same sense amplifier/write driver in conflict can be avoided.

Specifically, when word driver unit group WDUBG for port PB is used for the operation for selecting the word line in upper memory array 20a and word driver unit group WDUAG for port PA is used for the operation for selecting the word line in lower memory array 20b, the not-shown control circuit sets control signal SEL to "H" level for selector circuit group SLCGb provided between lower memory array 20b and sense amplifier/write driver 15c. On the other hand, the control signal for sense amplifier/write driver 15b is set to "L" level.

Accordingly, relation that bit line pair BLBP for port PB has electrically been connected to sense amplifier/write driver 15c through data line pair DLP during the normal operation becomes such that bit line pair BLAP for port PA is electrically connected to sense amplifier/write driver 15c through data line pair DLP.

Therefore, in the selection operation of port PA, switching from the configuration using sense amplifier/write driver 15b during the normal operation to sense amplifier/write driver 15c can be made. Specifically, when word driver unit group WDUBG for port PB is used for the operation for selecting the word line in upper memory array 20a and word driver unit group WDUAG for port PA is used for the operation for selecting the word line in lower memory array 20b, sense amplifier/write driver 15b is selected in correspondence with upper memory array 20a and sense amplifier/write driver 15c is selected in correspondence with lower memory array 20b. Therefore, the operation to use the same sense amplifier/write driver in conflict can be avoided and independent operations at port PA and port PB can be performed respectively.

Therefore, in the configuration according to the variation of the present third embodiment, when two different memory arrays are selected, word driver unit group WDUAG for port PA and word driver unit group WDUBG for port PB can access any memory array, irrespective of the upper memory array and the lower memory array.

In the present example, the configuration in which selector circuit group SLCG is provided between memory array 20a and sense amplifier/write driver 15b, between memory array 20b and sense amplifier/write driver 15c, and between memory array 20c and sense amplifier/write driver 15d has been described, however, the present example is not particularly limited as such. A configuration in which selector circuit group SLCG is provided between memory array 20a and sense amplifier/write driver 15a, between memory array 20b and sense amplifier/write driver 15b, and between memory array 20c and sense amplifier/write driver 15c and switching from bit line pair BLAP to bit line pair BLBP is made is naturally applicable.

In the embodiment above, a semiconductor memory device having dual ports representing one type of multiple ports has mainly been described, however, the embodiment is not limited as such and an example having a greater number of ports is also applicable.

It should be understood that the embodiments disclosed herein are illustrative and non-restrictive in every respect. The scope of the present invention is defined by the terms of the claims, rather than the description above, and is intended to include any modifications within the scope and meaning equivalent to the terms of the claims.

The invention claimed is:

1. A semiconductor memory device, comprising:
a memory array having a plurality of memory cells arranged in matrix;
first and second ports independent of each other, performing transmission and reception of an input/output signal;
a selection circuit capable of selection in accordance with addresses correspondingly input to said first and second ports, with periods of access to said memory array overlapping with each other;
said memory array including
a plurality of first and second word lines provided in correspondence with memory cell rows respectively, and
a plurality of first and second bit lines provided in correspondence with memory cell columns respectively,
each said memory cell including
a flip-flop circuit for setting first and second storage nodes to one and another of first and second potential levels in accordance with stored data,
a first gate transistor having a gate electrically coupled to a corresponding first word line, for electrically coupling a corresponding first bit line to said flip-flop circuit, and
a second gate transistor having a gate electrically coupled to a corresponding second word line, for electrically coupling a corresponding second bit line to said flip-flop circuit,
said selection circuit including
first and second row decoders provided in correspondence with said first and second ports and outputting row selection instructions in accordance with input addresses, respectively, and
a plurality of word drivers provided in correspondence with the memory cell rows respectively, each for driving the corresponding first and second word lines in accordance with a result of row selection by said first and second row decoders;
a first reading and writing circuit provided in correspondence with said first port and electrically coupled to said plurality of first bit lines, for performing data reading and data writing;
a second reading and writing circuit provided in correspondence with said second port and electrically coupled to said plurality of second bit lines, for performing data reading and data writing; and
a plurality of switching circuits corresponding to said first reading and writing circuit, provided in correspondence with the memory cell columns respectively, and each of said plurality of switching circuits switching connection of said first reading and writing circuit with the first bit line to electrical connection of said first reading and writing circuit with the second bit line in response to an instruction.

2. The semiconductor memory device according to claim 1, wherein
said plurality of memory cells included in said memory array are arranged along a row every prescribed number of bits,
external data is continuously stored every prescribed number of bits from a lower address row toward an upper address row,
said semiconductor memory device further comprises a control circuit controlling said plurality of switching circuits,
at least one of said first and second row decoders of said selection circuit outputs a row selection instruction for accessing the memory cells of the prescribed number of bits selected in accordance with an input address during data reading,
at least one of said first and second word lines corresponding to the lower address row and the upper address row adjacent to each other is activated in accordance with the row selection instruction from the at least one of said first and second row decoders, and
when the first word line corresponding to said lower address row and the second word lines corresponding to said upper address row and the second word lines adjacent to each other are both activated, among said plurality of switching circuits, said control circuit gives a switching instruction to a switching circuit corresponding to the memory cell column belonging to in the upper address row in a selected memory cell of the prescribed number of bits in accordance with said input address.

3. The semiconductor memory device according to claim 2, wherein
said input address has a row address and a column address designating a row and a column respectively for accessing memory cell of the prescribed number of bits,
when the column address included in said input address selects a starting memory cell from among the plurality of memory cells arranged every said prescribed number of bits, said first row decoder of said selection circuit outputs a row selection instruction activating said first word line based on said row address, and
when the column address included in said input address selects a memory cell other than the starting memory cell from among the plurality of memory cells arranged every said prescribed number of bits, based on the row address included in said input address, said first row decoder of said selection circuit outputs a row selection instruction activating said first word line corresponding to the lower address row and said second row decoder of said selection circuit outputs a row selection instruction activating the second word line corresponding to the higher address row.

4. The semiconductor memory device according to claim 1, further comprising a sorting circuit provided in correspondence with said first reading and writing circuit and changing sequence of data bits output from said first reading and writing circuit in accordance with an input address.

5. The semiconductor memory device according to claim 1, wherein
said memory array is arranged between said first reading and writing circuit and said second reading and writing circuit, and
said plurality of switching circuits are connected between said first reading and writing circuit and said memory array.

* * * * *